United States Patent
Tung et al.

(10) Patent No.: US 12,163,783 B2
(45) Date of Patent: *Dec. 10, 2024

(54) DIGITAL HOLOGRAPHY FOR ALIGNMENT IN LAYER DEPOSITION

(71) Applicant: Applied Materials, Inc., Santa Clara, CA (US)

(72) Inventors: Yeishin Tung, San Jose, CA (US); Byung Sung Kwak, Portland, OR (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 904 days.

This patent is subject to a terminal disclaimer.

(21) Appl. No.: 17/236,997

(22) Filed: Apr. 21, 2021

(65) Prior Publication Data
US 2022/0341722 A1 Oct. 27, 2022

(51) Int. Cl.
*G01B 9/021* (2006.01)
*C23C 14/04* (2006.01)
(Continued)

(52) U.S. Cl.
CPC ............ *G01B 9/021* (2013.01); *C23C 14/042* (2013.01); *C23C 14/12* (2013.01); *C23C 14/547* (2013.01); *G01B 11/06* (2013.01); *H10K 71/166* (2023.02)

(58) Field of Classification Search
CPC .... G01B 9/021; G01B 11/06; G01B 11/0675; G01B 11/0625; G01B 11/2441;
(Continued)

(56) References Cited

U.S. PATENT DOCUMENTS

| | | | |
|---|---|---|---|
| 6,213,845 B1 * | 4/2001 | Elledge | B24B 37/205 451/6 |
| 7,214,554 B2 * | 5/2007 | Winters | H10K 71/16 438/149 |

(Continued)

FOREIGN PATENT DOCUMENTS

| | | |
|---|---|---|
| CN | 106123770 | 11/2016 |
| JP | 2009-301768 | 12/2009 |

(Continued)

OTHER PUBLICATIONS

Office Action in Taiwanese Appln. No. 111114957, dated Mar. 21, 2023, 11 pages (with English summary and search report ).

(Continued)

*Primary Examiner* — Shahed Ahmed
*Assistant Examiner* — Khatib A Rahman
(74) *Attorney, Agent, or Firm* — Fish & Richardson P.C.

(57) ABSTRACT

An organic light-emitting diode (OLED) deposition system has a workpiece transport system configured to position a workpiece within the OLED deposition system under vacuum conditions, a deposition chamber configured to deposit a first layer of organic material onto the workpiece, a metrology system having one or more sensors measure of the workpiece after deposition in the deposition chamber, and a control system to control a deposition of the layer of organic material onto the workpiece. The metrology system includes a digital holographic microscope positioned to receive light from the workpiece and generate a thickness profile measurement of a layer on the workpiece. The control system is configured to adjust processing of a subsequent workpiece at the deposition chamber or adjust processing of the workpiece at a subsequent deposition chamber based on the thickness profile.

18 Claims, 11 Drawing Sheets

(51) Int. Cl.
  *C23C 14/12* (2006.01)
  *C23C 14/54* (2006.01)
  *G01B 11/06* (2006.01)
  *H10K 71/16* (2023.01)

(58) Field of Classification Search
  CPC ..... C23C 14/042; C23C 14/12; C23C 14/547; H10K 71/166
  See application file for complete search history.

(56) References Cited

U.S. PATENT DOCUMENTS

| | | | |
|---|---|---|---|
| 2004/0156098 A1* | 8/2004 | Dubois | ............... G01N 21/6458 359/368 |
| 2011/0189380 A1 | 8/2011 | Jang et al. | |
| 2011/0207244 A1 | 8/2011 | Sung et al. | |
| 2016/0077025 A1 | 3/2016 | Zhang et al. | |
| 2019/0148416 A1* | 5/2019 | Rui | ................... H01L 21/02186 257/71 |
| 2019/0317021 A1 | 10/2019 | Ghosh et al. | |
| 2020/0373183 A1 | 11/2020 | Lerner et al. | |
| 2021/0226182 A1 | 7/2021 | Tung et al. | |
| 2021/0226183 A1 | 7/2021 | Tung et al. | |
| 2021/0341282 A1* | 11/2021 | Cipriani | ................... G01N 1/42 |
| 2022/0171332 A1* | 6/2022 | Cuche | ................. G03H 1/0005 |

FOREIGN PATENT DOCUMENTS

| | | |
|---|---|---|
| JP | 2014-043600 | 3/2014 |
| KR | 10-2011-0027483 | 3/2011 |
| KR | 10-2016-0029606 | 3/2016 |
| TW | 200537978 | 11/2005 |
| TW | 201945562 | 12/2019 |

OTHER PUBLICATIONS

International Search Report and Written Opinion in International Appln. No. PCT/US2022/025643, mailed Aug. 1, 2022, 10 pages.

* cited by examiner

DIGITAL HOLOGRAPHY FOR ALIGNMENT IN LAYER DEPOSITION

TECHNICAL FIELD

This disclosure pertains to in-line monitoring of layer thickness and determination of alignment of deposited layers on a substrate.

BACKGROUND

An organic light-emitting diode (OLED or Organic LED), also known as an organic EL (organic electroluminescent) diode, is a light-emitting diode (LED) that includes a light emissive layer formed of a film of organic compound that emits light in response to an electric current. This organic layer is situated between two electrodes; typically, at least one of these electrodes is transparent. OLEDs are used to create digital displays in devices such as television screens, computer monitors, portable systems such as smartwatches, smartphones, handheld game consoles, PDAs, and laptops.

OLEDs typically include multiple organic layers, e.g., an electron injection layer (EIL), an electron transport layer (ETL), a hole blocking layer (HBL), the light emissive layer (EML), an electron blocking layer (EBL), a hole transport layer (HTL) and a hole injection layer (HIL). In some fabrication techniques, the multiple organic layers are formed by a sequential deposition process using multiple deposition chambers, where each chamber deposits a particular OLED layer on the substrate. In addition, some fabrication techniques use a shadow mask (aka a physical mask), e.g., a fine metal mask (FMM), during the deposition step in order to pattern the layer being deposited.

End-of-line metrology systems, in which manufactured substrates are measured after a complete run of the substrate through the multiple deposition chambers, have been used to monitor completed substrates to ensure that the OLED devices meet specifications. Such end-of-line methods may utilize optical imaging and/or ellipsometry techniques.

SUMMARY

In one aspect, an organic light-emitting diode (OLED) deposition system has a workpiece transport system configured to position a workpiece within the OLED deposition system under vacuum conditions, a deposition chamber configured to deposit a first layer of organic material onto the workpiece, a metrology system having one or more sensors measure the workpiece after deposition in the deposition chamber, and a control system to control a deposition of the layer of organic material onto the workpiece. The metrology system includes a digital holographic microscope positioned to receive light from the workpiece and generate a thickness profile measurement of a layer on the workpiece. The control system is configured to cause the deposition chamber to deposit a first layer of a first organic material onto the workpiece, cause the workpiece transport system to transfer the workpiece from the deposition chamber to a position at which the one or more sensors measure the workpiece, receive the thickness profile measurement from the metrology system, and adjust processing of a subsequent workpiece at the deposition chamber or adjust processing of the workpiece at a subsequent deposition chamber based on the thickness profile.

In another aspect, a computer program product comprises a non-transitory computer readable medium comprising instructions to cause one or more data processing apparatuses to cause a deposition chamber to deposit a layer of an organic material onto a workpiece in a device region and a first test region separate from the device region, cause a workpiece transport system to transfer the workpiece from the deposition chamber to measurement position for a metrology system, receive from a digital holographic microscope of the metrology system a thickness profile measurement of the layer on the workpiece, and adjust processing of a subsequent workpiece at the deposition chamber or adjust processing of the workpiece at a subsequent deposition chamber based on the thickness profile.

Implementations may optionally include, but are not limited to, one or more of the following possible advantages.

Alignment of shadow masks, characterized by the so-called "pixel placement accuracy" (PPA) measurement, can be improved and then resulting in a superior alignment maintained. Measurements can be made with lower lag time, preferably at the point of or just after an alignment deposition step, thus improving device pixel placement accuracy, and thereby increasing reliability and yield. Measurement of alignment of deposited layers to the substrate can be determined quickly in an in-line station, so as to not adversely impact throughput.

Unlike techniques that use a photoluminescent (PL) signal from an UV-excitation source, the present technique can utilize visible range excitation sources to determine the deposition profile and pattern location, which can reduce or eliminate potential UV-exposure induced degradation of the OLED layers. The measurements can be obtained without the use of moving parts, by using 2D array of characterization heads, and thereby reducing the risk of particles.

In addition, deposition topography can be determined as the system measures the profile of the deposited OLED layer though the shadow mask. One of the key requirements for good pattern transfer through a shadow mask is the so-called proximity requirement—that the gap between the substrate and the shadow mask be zero. Depending on the gap, the "shadow" (at the edges of the patterned deposition) would change. As such, the techniques described herein allow fast and simple determination of the status of this proximity requirement by measuring the shadow of a patterned deposition, from the same PPA measurement. Rapid in-line process monitoring and control for OLED PPA and shadow status can be achieved. The monitoring apparatus is customizable and can be integrated at one or more points in a production line, e.g., within multiple transfer chambers located between a series of deposition tools. The rapid analysis and feedback can fit within established TACT time (average time between the start of production of one unit and the start of production of the next unit) requirements. Obtaining feedback before the end-of-line for OLED deposition characteristics can result in improved device performance, tighter yields and yield enhancement, and reduced cost of production. Digital holographic microscopy (DHM) method exhibit high resolution and sensitivity to thin film characteristics, are relatively easier to model than other methods, and can be compatible with fiber optics-based implementation for remote sensing, which reduces the footprint and contamination inside the chamber. Due to the fast speed of the DHM measurements and a tolerance to focus offset and tilt variations, impact from vibration of the OLED system is minimized. Additionally, the hardware required to perform these in-line measurements is relatively easy to integrate with existing hardware which can result in lower cost of integration.

Unless otherwise defined, all technical and scientific terms used herein have the same meaning as commonly understood by one of ordinary skill in the art to which this invention belongs. Methods and materials are described herein for use in the present invention; other, suitable methods and materials known in the art can also be used. The materials, methods, and examples are illustrative only and not intended to be limiting.

Other features and advantages of the invention will be apparent from the following detailed description and figures, and from the claims.

BRIEF DESCRIPTION OF THE DRAWINGS

Like reference numbers and designations in the various drawings indicate like elements.

DETAILED DESCRIPTION

Figure 1:
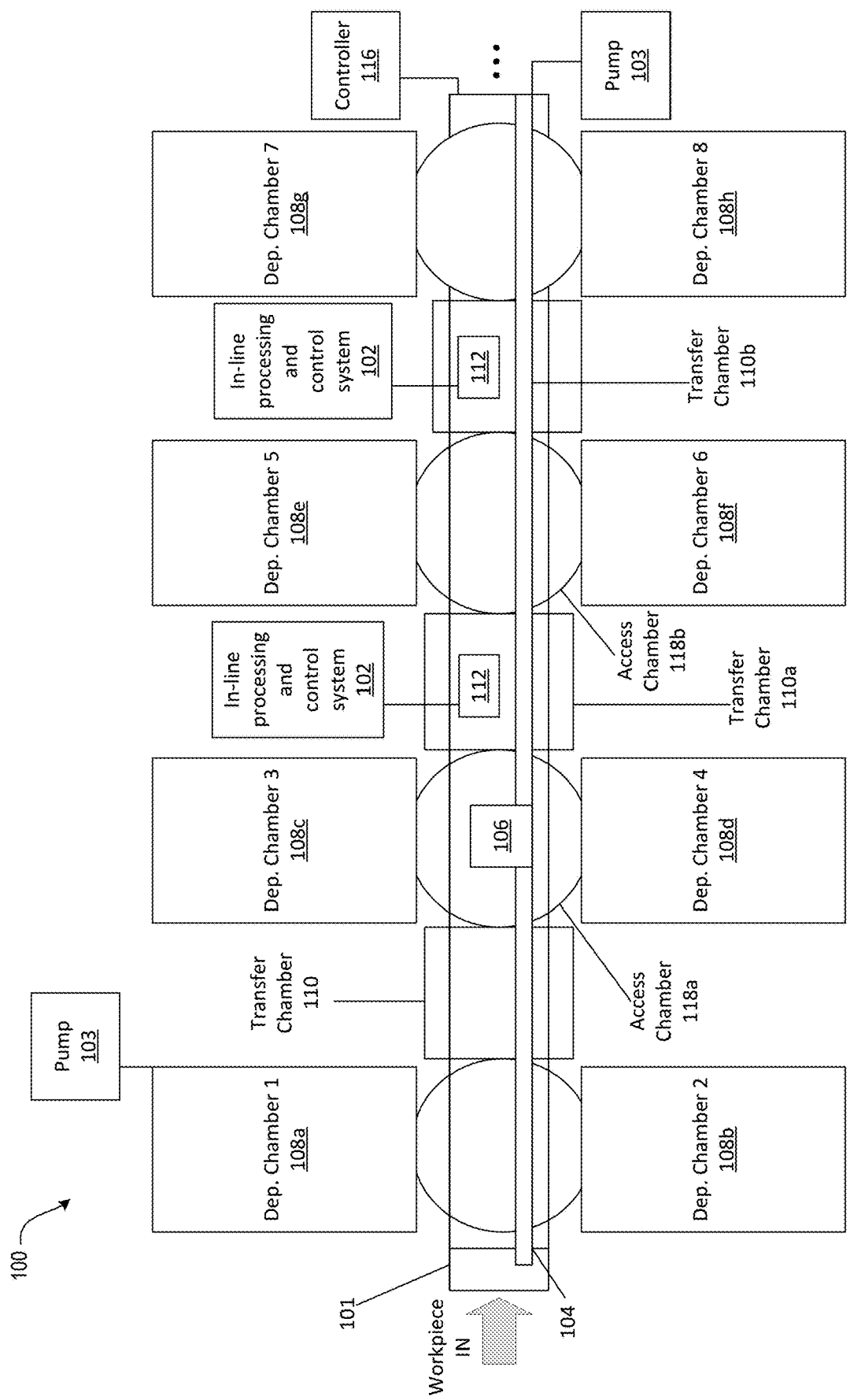
FIG. 1 illustrates a schematic of an example organic light-emitting diode (OLED) deposition system including an in-line process monitoring and control system.

Proper alignment of OLED layers to from the device stack is a critical factor in producing high performing and highly reliable OLED devices, and the positioning of the OLED layers in the stack depends on the alignment of the shadow masks used during deposition. Alignment of the OLED layers and the shadow masks can be characterized by a "pixel placement accuracy" (PPA) measurement.

A separate issue is the shadow effect from the shadow mask during deposition. In particular, deposition through a shadow mask can result in formation of a layer with sloped sidewalls. For example, deposition of a feature having a nominal width of about 40 microns can result in a bevel about 15 microns wide at the perimeter of the feature with the thickness of the feature varying from zero (at the outer edge of the bevel) to the full thickness (at the inner edge of the bevel). It may be desirable for the slope of the side wall to be uniform around the full perimeter of the feature. A measurement of the thickness profile, particularly at the feature edge, can be considered "shadow characterization."

Current manufacturing utilizes the so-called end-of-the line metrology where the status of alignment on a given substrate is characterized after all of the alignment events are completed when full device fabrication is completed. Variation of the alignment accuracy prior to the substrate reaching the end cannot therefore be detected, leading to substrates with poor alignment and thus yield loss. In addition, there is a significant lag between a start of a deposition process on an OLED production line and a characterization measurement by the end-of-line metrology of the one or more or all layers that are deposited, e.g., 15 to 60 minutes of delay, which can correspond to 30 to 60 panels/substrates that would be risked if a process excursion occurs—a huge yield loss. This lag includes both (1) time for the substrate to reach the end of the line, which depends on the number of layers, and (2) time needed for the measurement itself. Utilizing end-of-line measurements to provide process monitoring can result in a delay in a feedback loop to the OLED deposition system to become aware of any abnormal deposition processes occurring along the production line. In-line monitoring and control of OLED deposition is important for discovery of processing issues, yield control, and cost of production. In addition, optical imaging and/or ellipsometry methods can be sensitive to the vibration of the multiple deposition chambers of the OLED deposition system, making it difficult to extract process information related to dopant concentrations and layer thicknesses.

The technology of this patent application utilizes an in-line process monitoring and control system for providing in-line feedback to an organic light-emitting diode (OLED) production line, i.e., PPA measurements can be performed between the multiple deposition processes in the multiple chambers in the production line.

More particularly, the technology utilizes an in-line metrology head located within a transfer chamber between two or more deposition chambers of an OLED production line. The metrology head can include an array of metrology devices and that are positionable with respect to a workpiece including one or more deposited layers that are being measured, such that a particular region of the workpiece can be measured using the array of metrology devices of the metrology head. Metrology devices can provide feedback PPA and shadow characterization for two or more deposition chambers. Metrology devices for measuring PPA and shadow characterization can be digital holographic microscopy devices (DHM). The determined film location vs. fiducials and thicknesses/shadows can be used directly to determine PPA and shadow. The metrology head located within the transfer chamber can include a portion or all of the hardware necessary for performing the DHM. Alternatively, a portion of the in-line process monitoring and control system can be located outside of the transfer chamber, e.g., out of vacuum, such that the metrology head in-vacuum is configured to provide data (e.g., optical data, sensor data, etc.) to the in-line process monitoring and control system located outside of the vacuum (e.g., a spectrometer, data processing apparatus, etc.).

Measurements can be made on the one or more deposited layers on the workpiece using test regions located on the workpiece, where each test region can be a single layer of deposition by a particular deposition chamber of the OLED production line. Each test region can be selectively exposed to deposition of material in the particular deposition chamber using a mask deposition process, e.g., where the test region is selectively exposed to deposition of material in the particular deposition chamber.

As mentioned, misalignment of the shadow masks to the substrate or to previously deposited layers can result in layers being improperly aligned, which can lead to lower device reliability and reduced yield. Again, although pixel placement accuracy measurements can be made at the end-of-line, there is a significant lag between a start of a deposition process on an OLED production line and a characterization measurement by the end-of-line metrology, which can result in significant wasted production before an alignment problem is fixed.

A technique to compensate is measure layers deposited to deposit a test layer over a fiducial, e.g., a fiducial on the substrate or a previously deposited layer in the OLED stack. Digital holographic microscopy (DHM) can be used to measure the relative position of the deposition with respect to the test structure, either from one layer to another for from one layer to a fiducial on the substrate. This information can be used to determine the relative position of the mask to the substrate or of one mask to another mask. This information can be fed back to the deposition system to improve alignment of subsequent wafers, or fed forward to adjust processing of the wafer at subsequent deposition chambers.

In-Line Process Monitoring and Control System

FIG. 1 illustrates a schematic of an example organic light-emitting diode (OLED) deposition system 100 including an in-line process monitoring and control system 102. The OLED deposition system 100 can include one or more vacuum chambers connected together, e.g., using vacuum-isolation gate valves. In general, the OLED deposition system 100 is arranged as a closed processing line. The workpieces 106 are loaded into the deposition system 100 at a beginning of the line. The workpieces 106 are moved through and processed sequentially in multiple process chambers without being removed from the deposition system 100 and while being maintained in the controlled, e.g., vacuum, environment of the deposition system 100. Finally, the workpieces are unloaded from the deposition system 100 at the end-of-line. One or more load-lock chambers 101 can be connected to the OLED deposition system 100, e.g., at the beginning and end of the line, and can be used to separate the interior of the OLED deposition system 100 from the external environment while permitting the workpiece 106, to be loaded into/removed from the system 100. Vacuum conditions within the system 100 can be maintained by one or more vacuum pumps 103 in fluidic contact with the system 100. For example, pressures within the deposition chambers may be maintained below 10E-6 Torr during operation and pressures within transfer chambers and access chambers may be maintained below 10E-4-10E-5 Torr during operation of the system 100.

In some implementations, e.g., as shown in FIG. 1, the deposition system 100 includes multiple access chambers 118 arranged in sequence along the processing line, with one or more deposition chambers 108, e.g., a pair of chambers 108, connected to and accessible through each access chamber 118. However, many other configurations are possible, e.g., the deposition chambers themselves could be arranged in an end-to-end sequence with workpieces entering one side of the deposition chamber and exiting another side of the deposition chamber into an access chamber or a different deposition chamber.

The OLED deposition system 100 includes a workpiece transport system 104. The workpiece transport system 104 is configured to position a workpiece 106 within the OLED deposition system 100 under vacuum conditions. The workpiece transport system 104 can be configured to move the workpiece 106 between multiple deposition chambers 108 while maintaining vacuum conditions around the workpiece.

In some implementations, the workpiece transport system 104 includes a rail system, e.g., a non-contact magnetic levitation system, and one or more transfer arms for manipulating the workpiece 106 while maintaining vacuum around the workpiece 106, and where at least a portion of the transfer arms and rail system is located within the system 100. For example, the workpiece transport system 104 can include a rotary robot arm that is movable along the rail 106 and is capable of motion in Z, R and Θ.

Alternatively, the workpiece transport system 104 could include multiple robots, e.g., a robot in each access chamber 118, with each of the robots configured to receive a workpiece 106 from and hand the workpiece off to another robot in the line or a transfer chamber 110, as well as transfer the workpiece 106 into and out of an adjacent deposition chamber 108.

The workpiece 106 can include various substrates utilized in the fabrication of OLED layer stacks. In some implementations, a workpiece 106 is composed of a glass substrate. Other possible substrates include, but are not limited to, plastic, foils, or the like. The workpiece 106 can include one or more substrates, e.g., plastic, foils, etc., mounted on a carrier substrate, e.g., glass, silicon, etc., or a chuck, e.g., a molybdenum, ceramic, or stainless steel chuck. The workpiece 106 can vary in dimensions and shape, e.g., rectangular, circular, etc. Each workpiece 106 can accommodate multiple OLED layer stacks arranged on a surface of the workpiece 106. During the fabrication of the OLED layer stacks on the workpiece within system 100, multiple test regions can be formed to provide deposition process feedback to the system 100. Further discussion of the test regions is found below, for example, with reference to FIG. 4.

The OLED deposition system 100 includes multiple deposition chambers 108. Each deposition chamber 108 is configured to deposit a respective layer of organic material from the OLED layer stack that provides the OLED device onto the workpiece 106. For example, different chambers can be used to deposit different ones of an electron injection layer (EIL), an electron transport layer (ETL), a hole blocking layer (HBL), the light emissive layer (EML), an electron blocking layer (EBL), a hole transport layer (HTL), and a hole injection layer (HIL).

The listed materials can be deposited in the recited order, or in reverse of the recited order, depending on the device configuration and manufacturing process. The organic material in each of the multiple deposition chambers 108 can be selected to form an OLED or other organic-based light emitting or absorbing device. Each deposition chamber can be configured to include respective pumps, controllers, and monitoring devices to operate and monitor the respective deposition chamber 108. Multiple deposition chambers 108 can be used to deposit the same layer from the stack, e.g., to provide parallel processing of multiple workpieces and thus increase system throughput.

The multiple deposition chambers 108, e.g., 15 to 30 deposition chambers 108, can be arranged with respect to the system 100 such that each sequential layer to form the OLED is deposited by an adjacent deposition chamber 108.

In some implementations, one or more isolation valves and/or gate valves can be utilized to isolate each deposition chamber 108 from each other deposition chamber 108 and the system 100 at a given point in time, e.g., during a deposition process. In particular, one or more isolation valves and/or gate valves can be utilized to isolate each deposition chamber 108 from the adjacent access chamber 118.

Each of the multiple deposition chambers 108 is coupled together such that vacuum is maintained around the workpiece 106 while the workpiece is transferred between a first deposition chamber 108a and a second deposition chamber 108b of the two or more deposition chambers by the workpiece transport system 104.

The system 100 further includes one or more transfer chambers 110 interconnected to the two or more deposition chambers 108 and configured to receive the workpiece 106 from the two or more deposition chambers 108 by the workpiece transport system 104 while maintaining vacuum and retaining the workpiece 106 within the transfer chamber 110. As depicted in FIG. 1, transfer chamber 110a serves as the workpiece transfer point between deposition chambers 108c, 108d, and deposition chamber 108e, 108f, where a workpiece 106 can be transferred to the transfer chamber 110a from deposition chambers 108c-f, e.g., using the workpiece transfer system 104. In particular, the transfer chamber 110a can be located between access chambers 118a and 118b; workpieces are transferred from deposition chambers 108a or 108b, through the access chamber 118a into the transfer chamber 110a, and then from the transfer chamber 110a through the access chamber 118b to deposition chambers 108c or 108d.

In some implementations, the transfer chamber 110 can be isolated from the two or more deposition chambers 108 using one or more isolation valves and/or gate valves. The transfer chamber 110 can include a respective vacuum pump 103 and vacuum monitoring devices, e.g., a vacuum gauge and controller, to monitor a vacuum level within the transfer chamber 110. At least a portion of the in-line processing and control system 102 can be located within the transfer chamber 110, as depicted in FIG. 1.

In-line processing and control system 102 is configured to perform one or more measurements on the workpiece 106 while the workpiece 106 is located within the transfer chamber 110 and under vacuum conditions. Furthermore, the one or more measurements performed by the in-line processing and control system 102 can occur between deposition processes of the respective deposition chambers 108 during a sequence of depositions on the workpiece 106 to form an OLED layer stack. For example, in-line processing and control system 102 is configured to perform one or more measurements on a workpiece 106 after respective deposition processes, e.g., respective depositions of layers of organic materials, are performed by deposition chambers 108a-d and prior to a deposition by deposition chamber 108e.

In another example, in-line processing and control system 102 is configured to perform one or more measurements on a workpiece 106 after a deposition process, e.g., a deposition of an organic layer on the workpiece, by deposition chamber 108f and prior to a deposition process on the workpiece 106 by deposition chamber 108g.

In some implementations, in-line processing and control system 102 is configured to perform the one or more measurements on the workpiece in multiple transfer chambers 110, e.g., chamber 110a and 110b. At least a portion of the in-line processing and control system 102 can be located within the transfer chamber 110 and under vacuum conditions and can be in data communication with one or more data processing apparatuses and/or controllers located outside of vacuum.

In some implementations, additional optics and measurement devices may be located outside of vacuum and can receive a signal from a metrology head 112 located within the transfer chamber 110, e.g., within vacuum. The signal from within the transfer chamber 110 can be transmitted to the in-line processing and control system 102, e.g., wirelessly or through a communication line that extends through a port in a wall of the transfer chamber 110. In some implementations, the metrology head 112 is located outside the transfer chamber, 110, and has a view of the workpiece using a viewport located on the transfer chamber 110 wall. In some implementations, a sensor of the metrology head 112 is located outside the transfer chamber 110, and light reflected or transmitted from the workpiece passes through a fiber optic connect using a vacuum feedthrough to the sensor.

The in-line processing and control system 102 can receive measurement data from at least one metrology head 112. The in-line processing and control system 102 can receive measurement data from multiple metrology heads 112 located at respective multiple transfer chambers 110 and/or multiple in-line processing and control system 102 can each collect measurement data, e.g., using a data processing apparatus 114 in data communication with the one or more metrology heads 112, from respective metrology heads 112.

The one or more metrology heads 112 can each include multiple characterization devices, e.g., an array of characterization devices, and are at least partially located within a transfer chamber 110. Further details of the configuration of the metrology head 112 are discussed with reference to FIGS. 3A and 3B below.

The metrology head 112 is positionable with respect to the workpiece 106 that is retained within the transfer chamber 110. For example, the metrology head 112 can be mounted within the transfer chamber 110 to have multiple degrees of freedom, e.g., tip/tilt or linear actuation, with respect to a surface of the workpiece 106. Metrology head 112 can include sensors to assist with alignment of the metrology head 112 with respect to the surface of the workpiece 106, e.g., to set a particular distance between an objective lens of the metrology head 112 and the surface of the workpiece 106.

Each metrology head 112 is configured to perform multiple measurements on the workpiece 106 while the workpiece is located within the transfer chamber 110. Further details of the different measurements performed by the metrology head 112 are discussed below with reference to FIGS. 2A and 2B.

In some implementations, the metrology head 112 or transfer chamber 110 can include a vibration sensor to measure a level of vibration of the workpiece 106 and metrology head 112 during a measurement of the workpiece 106. The measurements on the workpiece 106 can be performed within a frequency range that is faster than the vibration-induced displacement of the workpiece by the operation of the system 100. Additionally, averaging processes, normalization, or similar post-processing methods can be applied to the measurements to account for the vibration of the workpiece 106 and metrology head 112 during the measurements of the workpiece 106.

The system 100 further includes a controller 116 operable to control a sequential deposition of the respective layers of organic material onto the workpiece 106 by the multiple deposition chambers 108, e.g., two or more deposition chambers 108, to form an organic light-emitting diode layer stack. The controller 116 can be in data communication and operable to coordinate the location of the workpiece 106 using the workpiece transfer system 104 within the system 100 such that the workpiece 106 is sequentially moved to each respective deposition chamber 108 in turn.

Additionally, the controller 116 can be configured to receive process feedback data from the in-line processing and control system 102, where the process feedback data received can be utilized by the controller 116 to determine one or more changes to the operation of the system 100 for the fabrication of an OLED layer stack. Further details of the process feedback are discussed below with reference to FIGS. 2A, 2B, and 7.

Figure 2A:
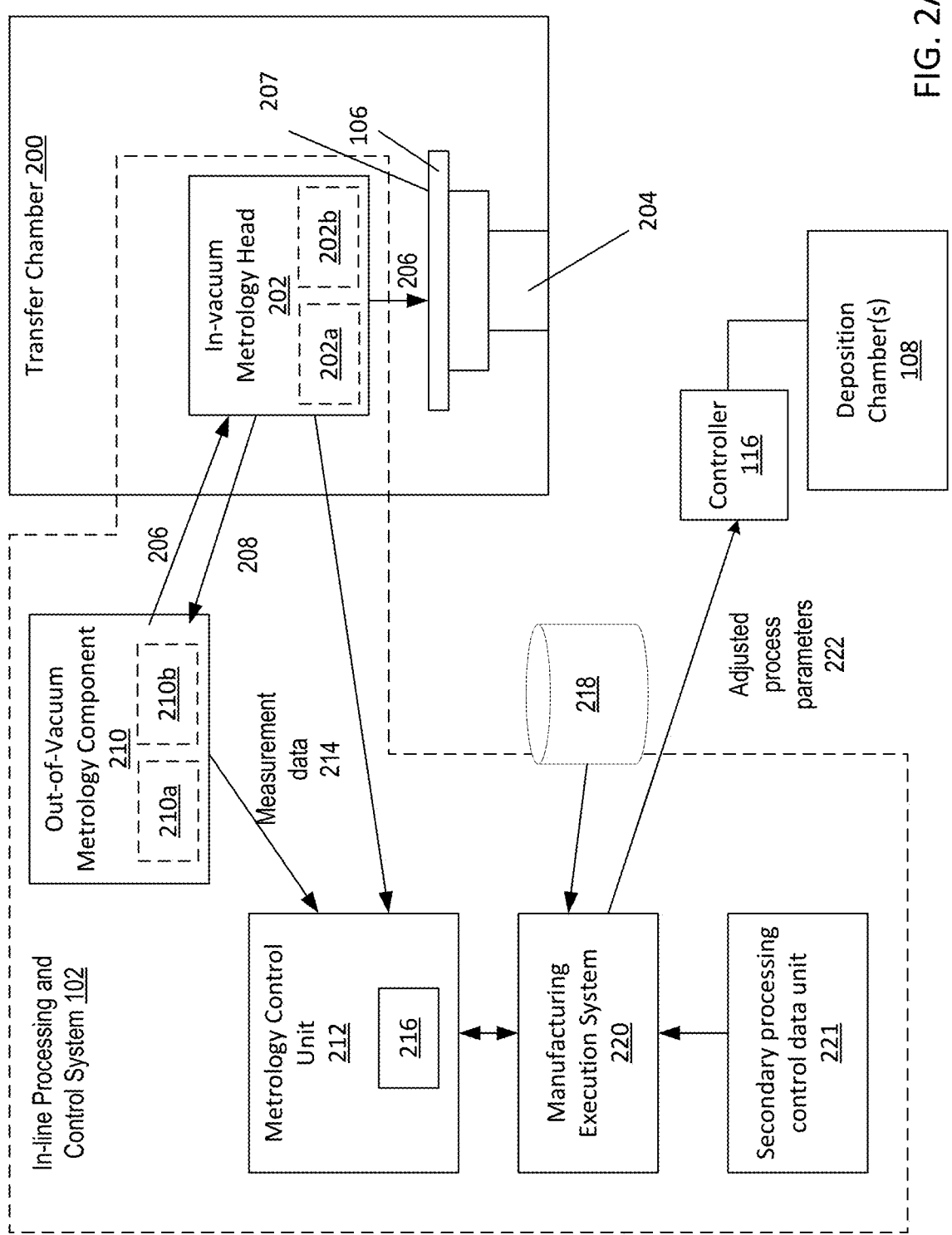
FIG. 2A illustrates a schematic of an example transfer chamber including an in-line process monitoring and control system.

In some implementations, the metrology head 112 is configured to perform one or more measurements on the workpiece 106 within the transfer chamber 110. FIG. 2A illustrates a schematic of an example transfer chamber 200, e.g., transfer chamber 110, including an in-line process monitoring and control system 102 that is configured to perform measurements on the workpiece 106.

The in-line process monitoring and control system 102 can include an in-vacuum metrology head 202, e.g., metrology head 112, that is located within the transfer chamber 200 and positionable within the transfer chamber 200 with respect to a workpiece 106 that is located within the transfer chamber 200. The workpiece 106 can be supported in the transfer chamber on a mount 204, e.g., a pedestal, platform, set of lift-pins, springs, etc. In some embodiments, the workpiece can be chucked to the mount 204, e.g., the mount can be an electrostatic chuck. In some embodiments, the work piece, e.g., the glass substrate, is placed on an electrostatic chuck and the workpiece and chuck travel together through the deposition system.

In some implementations, the in-vacuum metrology head 202 includes optical components to couple light from in-vacuum components 202a, 202b through free-space to the workpiece 106 on the mount 204. The in-vacuum metrology head 202 can include one or more fiber optics coupled from an out-of-vacuum component 210 into the transfer chamber 200 via a vacuum feedthrough.

In some implementations, the in-vacuum metrology head 202 can include one or more in-vacuum components, e.g., a first in-vacuum component 202a for performing photoluminescence (PL) measurements on the workpiece 106 located in the transfer chamber 200 and a second in-vacuum component 202b for performing reflectometry measurements on the workpiece 106 located in the transfer chamber 200. Each of the in-vacuum components 202a, 202b of the in-vacuum metrology head 202 can be separately positionable with respect to the workpiece, e.g., to account for a particular focal distance of the particular in-vacuum component 202a, 202b. Each in-vacuum component 202a, 202b of the in-vacuum metrology head 202 can provide respective light signal 206 incident on a surface 207 of the workpiece 106 and collect a reflected signal 208 from the surface 207 of the workpiece 106, e.g., using collection optics and/or a detector located in the metrology head 202. Further details of the configuration of the optical components for performing reflectance and PL measurements are described below with reference to FIG. 5.

In some implementations, the in-vacuum metrology head 202 can include a first in-vacuum component 202a for performing interferometric measurements on the workpiece 106 in the transfer chamber 200 and a second in-vacuum component 202b for performing photoluminescence (PL) measurements on the workpiece 106 in the transfer chamber 200. The interferometric measurements may be performed as part of a digital holographic microscopy (DHM) process. Further details of the configuration of the optical components for performing PL and DHM measurements is described below with reference to FIG. 6.

Although photoluminescence measurements are useful to determine dopant concentration, if the system is being used solely to measure PPA and shadow characterization, then only the DHM measurement is needed. In this case, only a single optical assembly is required, e.g., just the first in-vacuum component 202a can be used for performing interferometric measurements on the workpiece 106 as part of the DHM process, and the second optical assembly can be omitted.

Each in-vacuum component 202a, 202b of the in-vacuum metrology head 202 can provide an output signal 208 to an out-of-vacuum metrology component 210, where each output signal 208 can be a different wavelength range, different intensity, etc. The out-of-vacuum metrology component 210 can include one or more out-of-vacuum components, e.g., out-of-vacuum components 210a, 210b, that correspond to respective in-vacuum components 202a, 202b. For example, a first out-of-vacuum component 210a can include a PL measurement apparatus that is located out-of-vacuum and that corresponds to an in-vacuum component 202a of the in-vacuum metrology head 202 for performing PL measurements, including a spectrometer, a light modulation source, and the like.

The operations of the in-vacuum metrology head 202 and out-of-vacuum metrology component 210 of the in-line processing and control system 102 can be controlled by a metrology control unit (MCU) 212 that is in data communication with the respective in-vacuum metrology head 202 and out-of-vacuum metrology component 210. In some implementations, each of the respective in-vacuum components 202a, 202b and out-of-vacuum components 210a, 210b is in data communication with an MCU 212 and/or can each have a respective MCU 212 that is configured to perform measurements and receive data from the respective metrology component.

In some implementations, an MCU 212 can control the operations of multiple different metrology components located in respective transfer chambers 200, e.g., transfer chambers 110a and 110b as depicted in FIG. 1.

The MCU 212 additionally is configured to collect measurement data 214 from the out-of-vacuum metrology component 210, where the measurement data 214 includes, for example, PL data, reflectance data, DHM-generated data, transmission data, and the like. The measurement data 214 provided to the MCU 212 can be analyzed to obtain measured values 216 for one or more deposition characteristics of the deposited layers on the workpiece 106. The measured values 216 can in turn be utilized to adjust process parameters of the deposition chambers 108 of the system 100 for subsequent workpieces, i.e., a feedback process. The deposition characteristics can include intrinsic and extrinsic characteristics, for example, doping concentration of one or more deposited layers, layer thicknesses of the one or more deposited layers, surface morphology (e.g., surface roughness) of the one or more deposited layers, and the like. Extraction of the values for the deposition characteristics by the MCU 212 is discussed below in further detail with reference to FIGS. 5 and 6.

The values 216 for the deposition characteristics are provided to a manufacturing execution system (MES) 220. The IVIES 220 can receive measurement data 214 and/or values 216 for deposition characteristics from multiple MCU 212 for a particular transfer chamber 200 or from multiple transfer chambers 220. The MES 220 can compare the measured values 216 for the deposition characteristics to a set of desired values 218 for the deposition characteristics, e.g., desired doping ranges for respective layers, desired layer thicknesses, and the like, and generate one or more adjusted values 222 for the process parameters to compensate for deviations of the deposition characteristics from the desired values. The adjusted process parameters 222 can be provided to one or more of the deposition chambers 108 of the system 100.

In some implementations, the deposition characteristics include dopant concentration and layer thickness for a particular deposited layer. The values 216 for the deposition characteristics are provided to the manufacturing system in a closed-loop feedback system to be used in adjusting fabrication parameters of the manufacturing/deposition process. Algorithms can be employed to receive normalized doping concentration as input and provide, as output, one or more fabrication parameters to one or more deposition chambers 108, e.g., depending on the number of films measured during the characterization step.

In some implementations, the IVIES 220 can be configured to determine, from the values 216 for the deposition characteristics, updated processing information for one or more of the deposition chambers 108 and provide, to the one or more of the deposition chambers 108, updated processing information. The values 216 for the deposition characteristics can include deposition rate data for the particular deposition chamber 108 and doping concentration data for a particular deposition chamber 108 of the multiple deposition chambers.

In some implementations, measurements on the workpiece 106 within the transfer chamber includes a thickness measurement of a layer deposited in a particular deposition chamber and a doping concentration of the given layer of a plurality of layers deposited by the particular deposition chamber 108 of the two or more deposition chambers.

In some implementations, secondary processing control data can be provided to the IVIES 220 by one or more second processing control data units 221. Secondary processing control data can be, for example, device performance data correlating to thicknesses of deposited layers and dopant level measurements. Device performance data can include, for example, color coordinate data and luminescence data collected from OLED devices. The device performance data can be combined with the thickness and dopant level measurements performed using system 100 to determine the proper process adjustments.

Figure 2B:
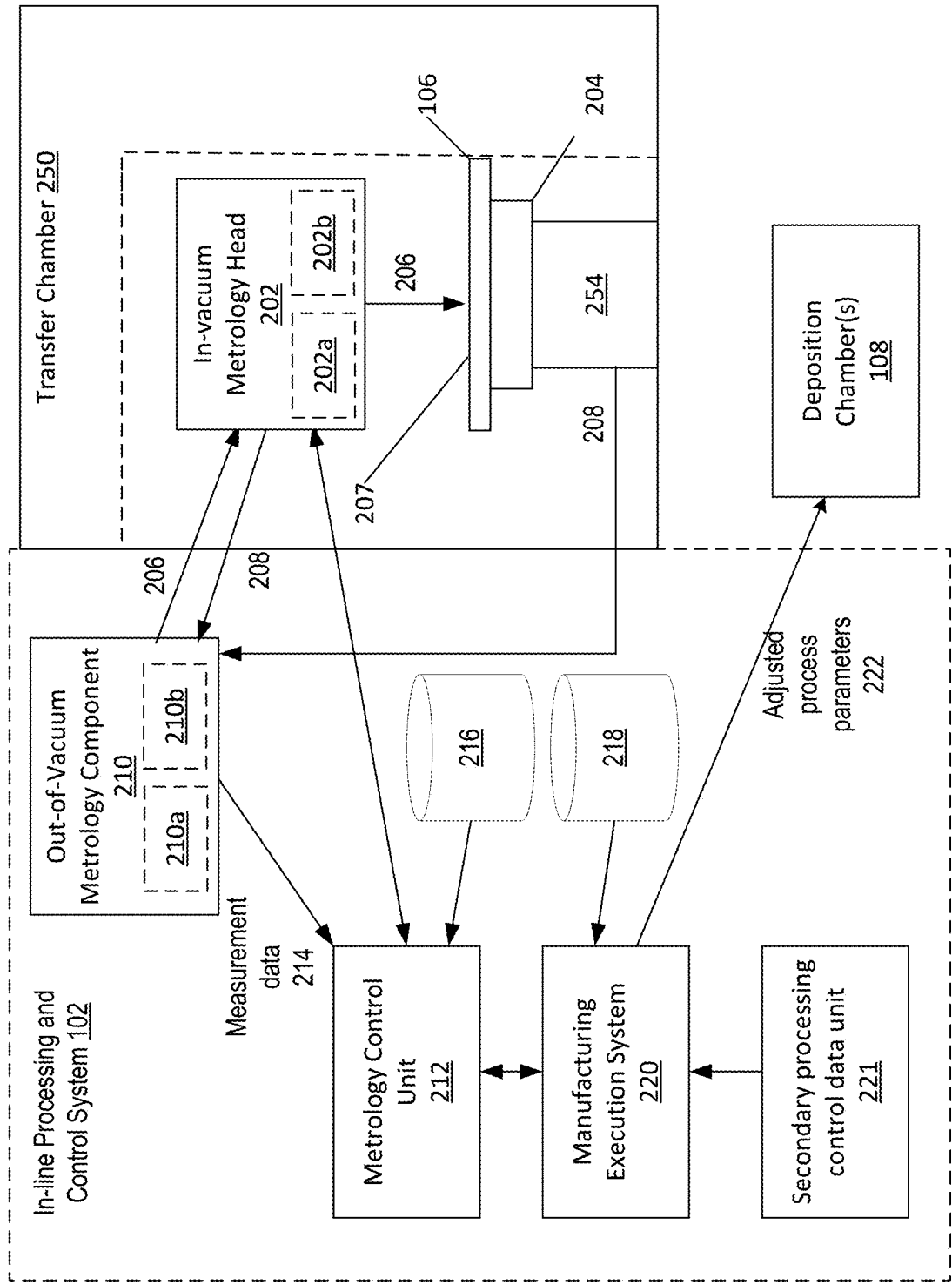
FIG. 2B illustrates a schematic of another example transfer chamber including an in-line process monitoring and control system.

In some implementations, the in-vacuum metrology head of the in-line processing and control system 102 is configured to perform transmission-based measurements on the workpiece 106 within the transfer chamber 110. FIG. 2B illustrates a schematic of another example transfer chamber 250 including an in-line process monitoring and control system 102.

As depicted in FIG. 2B, the in-line processing and control system 102 includes an in-vacuum component 254, e.g., a detector, that is located opposite of the surface 207 of the workpiece 106. In some implementations, the detector 254 can be affixed to the in-vacuum workpiece mount 204 such that a light signal that is transmitted through the workpiece can be collected by the detector 254.

In some implementations, in-vacuum component 254 includes collection optics and a spectrometer located opposite of the surface 207 of the workpiece 106 to perform transmission measurements. In the example depicted in FIG. 2B, transmission measurements are performed on a workpiece 106 where the workpiece does not have any metallization or other back contact layer to prevent transmitted light from one or more deposited layers from reaching the detector 254. Collected light signal 208 from the detector 254 can be provided back to the out-of-vacuum metrology component 210, e.g., as electrical signals.

In some implementations, the metrology head 112 is configured to perform a combination of transmission-based and reflectance-based measurements on the workpiece 106, including multiple in-vacuum metrology heads, e.g., in-vacuum components 202a, 202b and 254, positioned with respect to the workpiece to capture reflectance and transmission data, respectively.

Figure 3B:
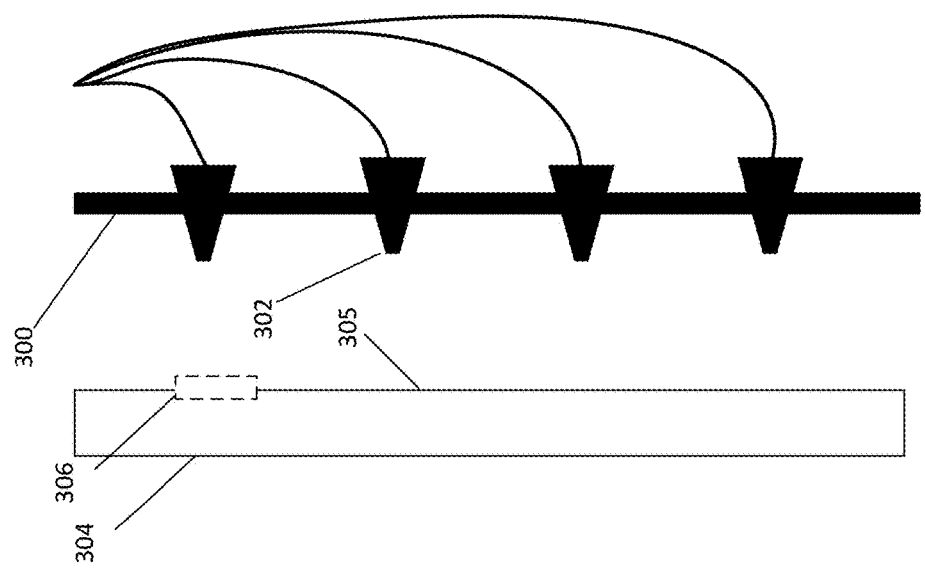
FIG. 3B illustrates a cross-sectional schematic of a metrology device array of FIG. 3A along line B-B.
Figure 3A:
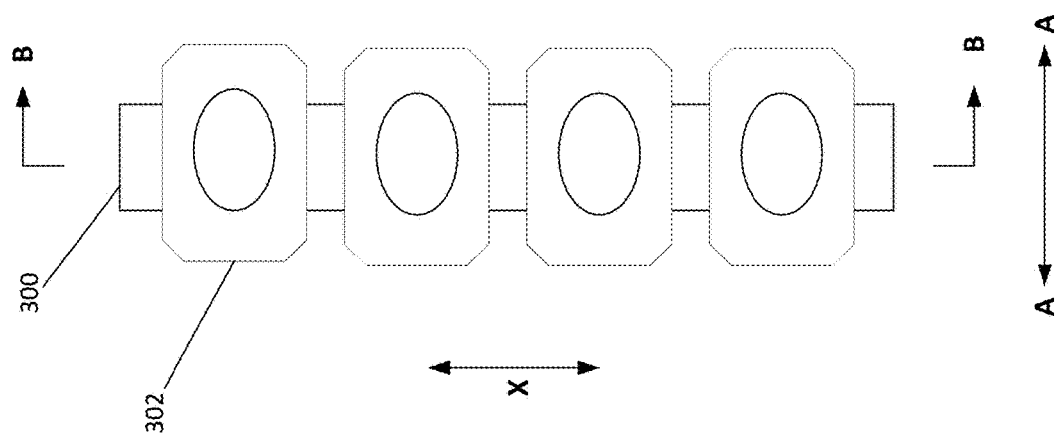
FIG. 3A illustrates a schematic of a metrology device array.
Figure 3C:
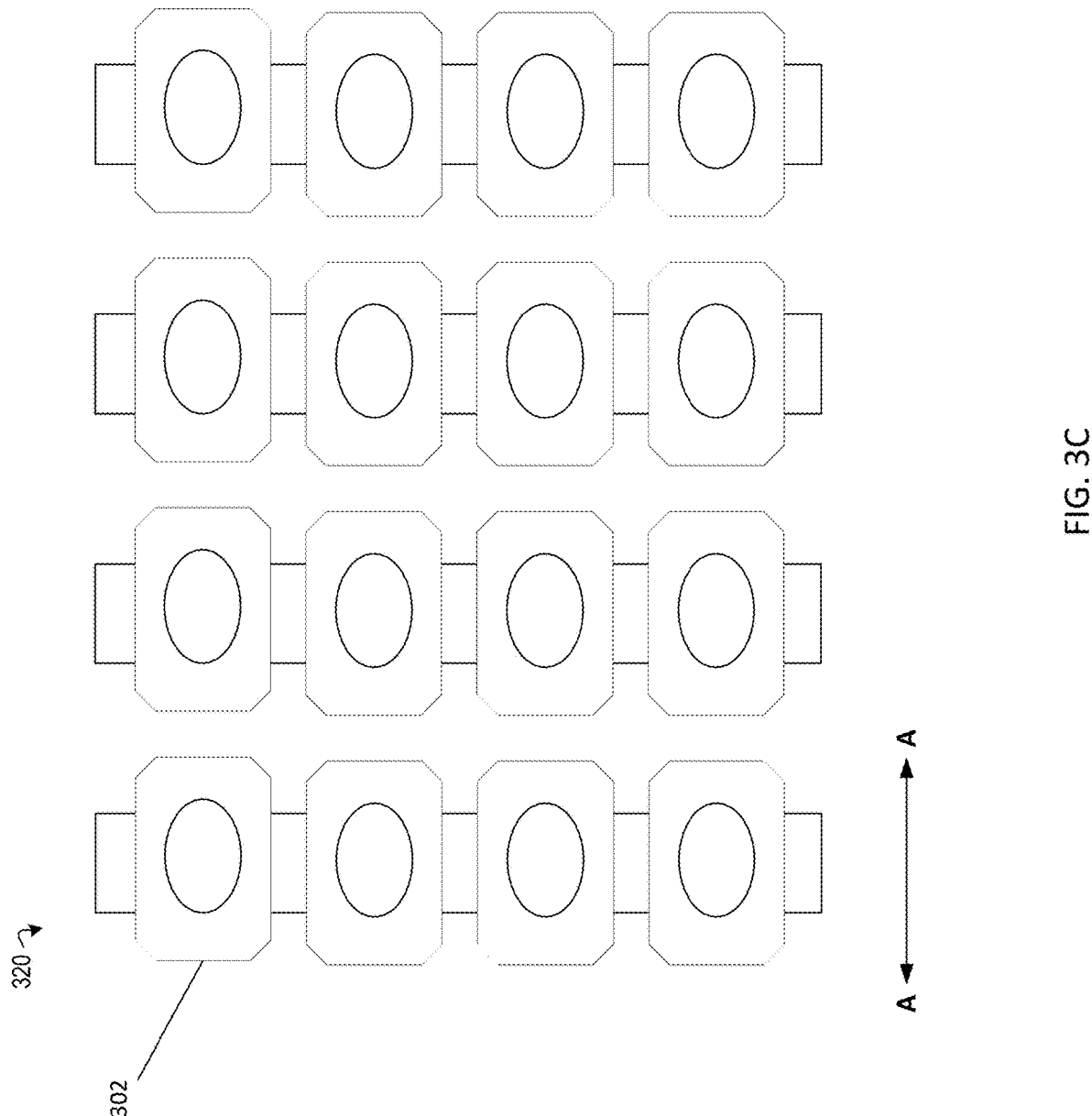
FIG. 3C illustrates a two-dimensional array of metrology devices.

In some implementations, the in-vacuum metrology head 202 can include multiple metrology devices, e.g., light sources, detectors, collection optics, or the like, where the multiple metrology devices can be arranged in an array that is positionable with respect to a workpiece 106 in the transfer chamber 112. FIGS. 3A-3C illustrate schematics of a metrology device array 300. As depicted in FIG. 3A, a metrology device array 300 can include multiple metrology devices 302 aligned with respect to axis A-A. Referring now to FIG. 3B, which depicts a cross-section of the metrology device array 300 along line B-B in FIG. 3A, the metrology device array 300 can be positioned with respect to a workpiece 304, e.g., workpiece 106.

In some implementations, the metrology device array 300 can be positioned with respect to a surface 305 of the workpiece 304, such that each metrology device 302 can independently measure a respective test region 306 located on the workpiece 304 to procure measurement results from multiple test regions simultaneously. A further discussion of test regions and layout on the workpiece is provided below with reference to FIG. 4.

In some implementations, as depicted in FIG. 3A, the metrology device array 300 can consist of multiple metrology devices 302 arranged in a linear configuration along a particular axis, e.g., the X-axis. A linear actuator can scan the metrology device array 300 linearly across the workpiece in a direction perpendicular to the X-axis so as to collect measurements from across the entire workpiece.

FIG. 3C depicts a two-dimensional array of metrology devices 302, where the metrology device array 320 includes a panel of metrology devices arranged along a multiple axis. This array of metrology devices 302 can remain stationary while collecting measurements from across the entire workpiece.

Figure 4:
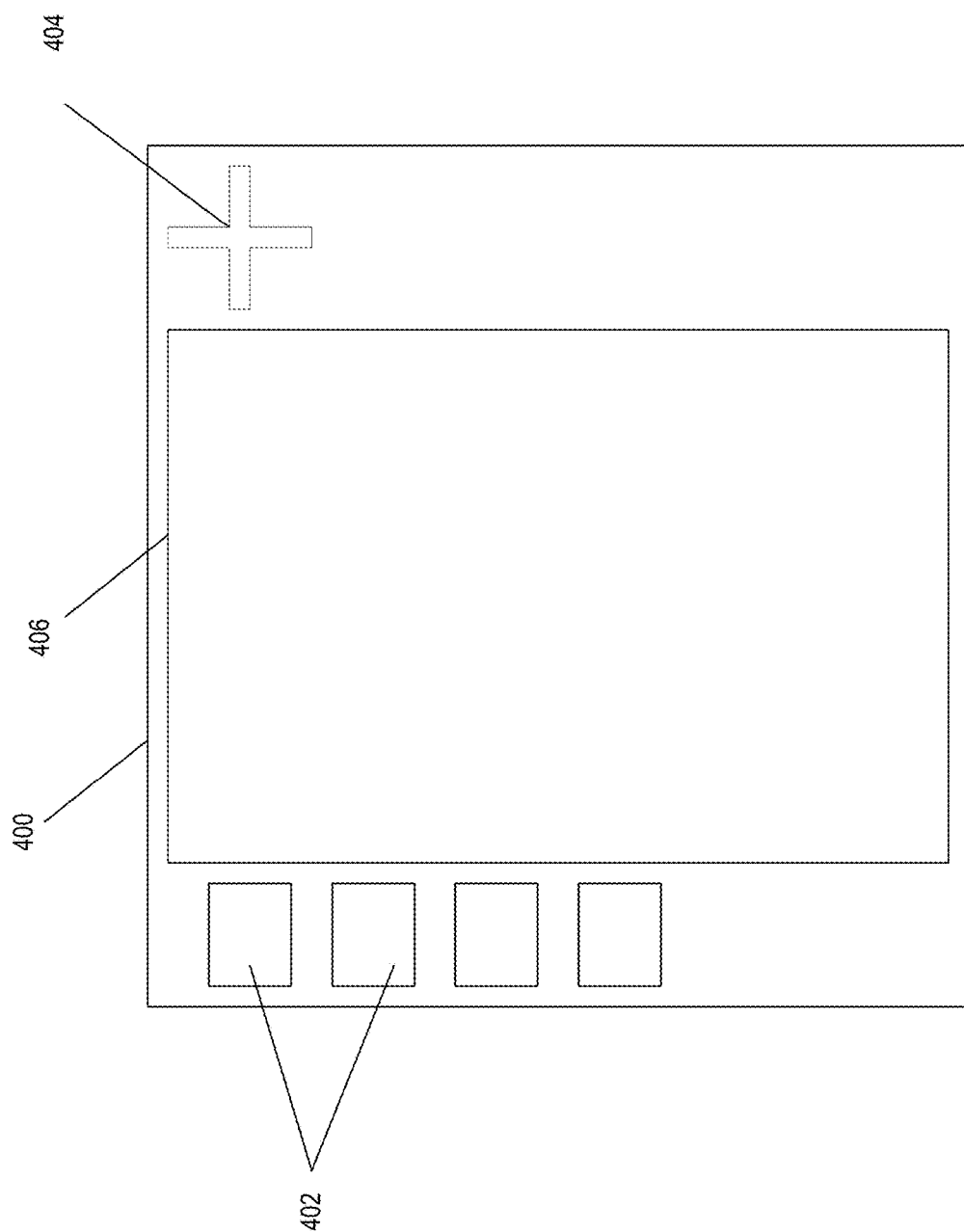
FIG. 4 illustrates a schematic of an example workpiece including test regions.

FIG. 4 illustrates a schematic of an example workpiece including test regions. Workpiece 400, e.g., workpiece 106, includes multiple test regions 402 deposited on the workpiece 400 by respective deposition chambers 108 of the system 100 as well as at least one device region 406. The device region 406 includes multiple layers deposited on the workpiece 400, e.g., two or more of an electron layer (EIL), an electron transport layer (ETL), a hole blocking layer (HBL), a light emissive layer (EML), an electron blocking layer (EBL), a hole transport layer (HTL) and a hole injection layer (HIL), to form one or more OLED devices within the device region 406. Each test region 402 can provide deposition information related to the performance of a particular deposition chamber 108. Device region 406 may additionally include test regions 402, where information about the multiple deposited layers on the workpiece 400 can be extracted from measurements performed on the device region 406.

In some implementations, the multiple layers deposited on the workpiece 400 are each deposited in sequence by a respective deposition chamber of the multiple deposition chambers, e.g., multiple deposition chambers 108 of system 100. Each deposited layer of the multiple deposited layers on the workpiece 400 is deposited by a respective deposition chamber 108 through a mask, e.g., a hard mask or a resist mask. The masks can have identical patterns for the device region 406, so that each layer is deposited in an overlapping manner on the same device region 406. On the other hand, the different masks for the different layers have apertures at different locations defining the different test regions 402. In other words, the test region 402 for a particular deposited layer is at a unique location on the workpiece 400, such that each deposited layer of the multiple layers deposited on the workpiece 400 has a different test region 402.

In some implementations, characterization measurements can be performed on pre-designated process measurement features, e.g., thickness squares, fiducial features, or on single deposited layers. As depicted in FIG. 4, test regions 402 can be utilized for characterization measurements of particular layers, where each test region may correspond to a particular deposited layer from a respective deposition chamber 108, e.g., each test region is a single layer thick and composed of a deposited layer of a particular organic material.

Each test region 402 includes a subset, i.e., less than all of, the deposited layers from the device region 406. In some implementations, each of some or all of the test regions 402 includes exactly one of the deposited layers from the device region 406. In some implementations, each of some or all of the test regions 402 include a deposited layer corresponding to exactly one of the multiple deposition chambers 108. By scanning multiple test regions 402 on the workpiece 400 using the metrology head 112, e.g., metrology device array 300, the in-line process and control system 102 can perform a set of characterization measurements on the multiple test regions 402 and extract deposition information for each of the multiple deposition chambers 108.

Because each test region 402 includes only a single layer deposited directly onto the underlying workpiece 400, a relatively simple optical model can be used, thus reducing computing load. In addition, uncertainty in the thickness measurements due to variations in underlying layers is reduced or eliminated.

In some implementations, each test region 402 can include multiple layers deposited onto the workpiece 400, where deposition characteristics may be extracted from measurements made on the multiple deposited layers of a particular test region 402 using deconvolution techniques. Sequential measurements of each layer of the multiple deposited layers can be performed prior to the deposition of the subsequent layers in order to extract deposition characteristics for the multiple layer stack.

In some implementations, a test region can be an alignment hash 404, where the alignment hash 404 can serve both as a test region for deposition characterization as well as alignment marks for aligning the metrology head 112 and/or aligning the workpiece 400 within a deposition chamber 108 during a deposition process.

Figure 5:
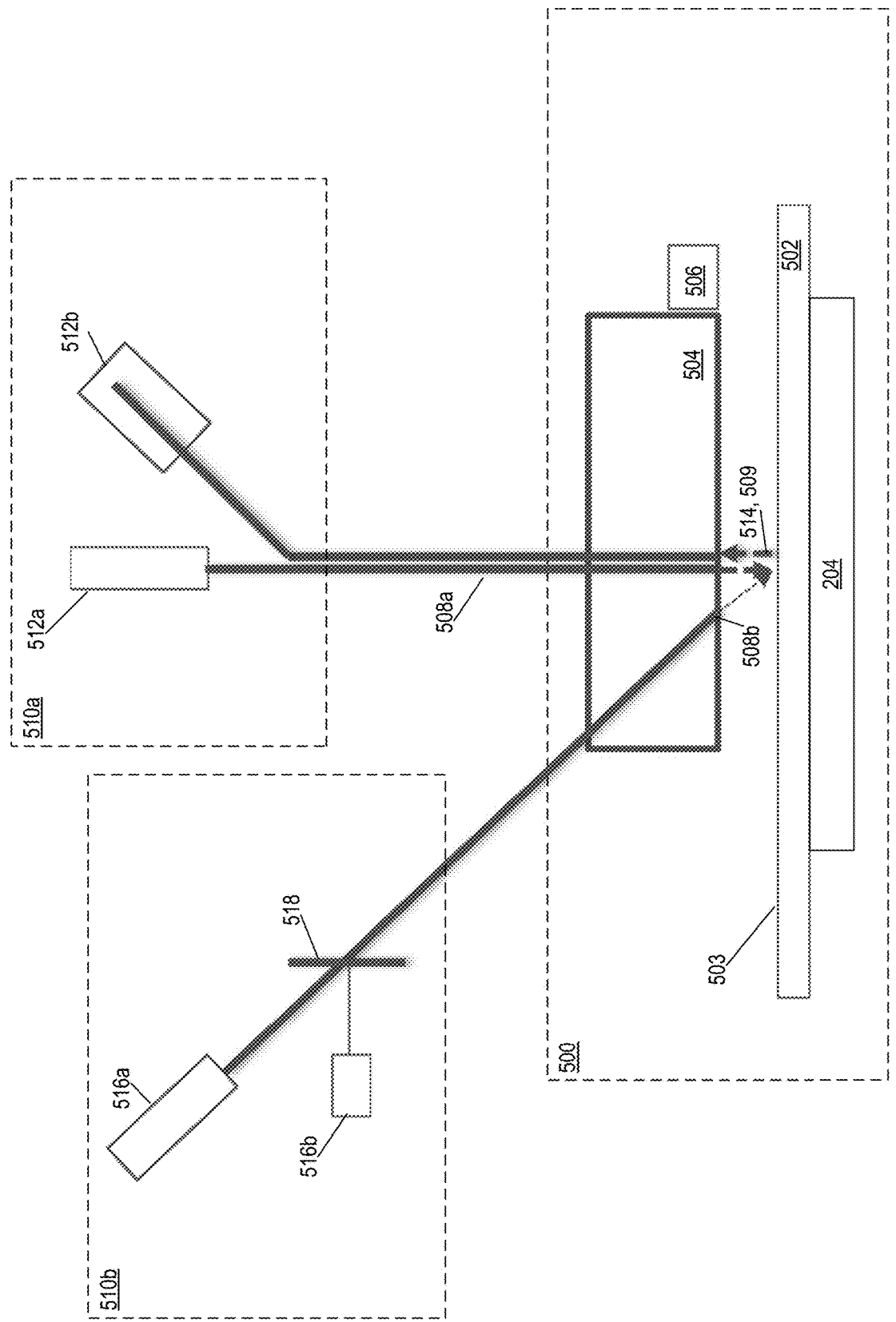
FIG. 5 illustrates a schematic of an example reflectometry and photoluminescence apparatus for an in-line process monitoring and control system.

As described above with reference to FIGS. 2A and 2B, the in-line process and control system can perform multiple different characterization measurements on the workpiece within the transfer chamber to extract deposition characteristics related to the deposition processes for the multiple deposition chambers 108. Referring now to FIG. 5, in some embodiments, the characterization measurements performed on the workpiece 108 include reflectometry and photoluminescence measurements. FIG. 5 illustrates a schematic of an example reflectometry and photoluminescence apparatus for an in-line process monitoring and control system.

As depicted in FIG. 5, a workpiece 502, e.g., workpiece 106, is located within the transfer chamber 500, e.g., on a mount 204. An in-vacuum metrology head 504, e.g., in-vacuum metrology head 202, can be located within the transfer chamber 500 and is configured to be positionable with respect to the workpiece 502. A height/tilt sensor 506 located on the in-vacuum metrology head 504 can determine a position and/or tilt of the workpiece 502 with respect to the head 504. The head 504 can be positioned to maintain a constant height and tilt with respect to a surface 503 of the workpiece 502. The support 204 and/or the head 504 can be coupled to one or more actuators that provide relative motion so as to achieve the desired relative height and tilt.

The in-vacuum metrology head 504 can further be configured to direct, e.g., via a set of optical components, one or more light beams 508 to a surface 503 of the workpiece 502. In some implementations, the one or more light beams 508 can be directed to the surface 503 of the workpiece using one or more of free space optics and/or fiber optics. The multiple light beams 508 can each have respective different values for one or more optical characteristics including, for example, wavelength ranges, light intensities, pulse shape, and the like.

As depicted in FIG. 5, multiple out-of-vacuum metrology components 510a, 510b can be in data communication with the in-vacuum metrology head 504. Out-of-vacuum metrology component 510a includes multiple metrology components 512 for performing reflectometry measurements on the workpiece 502, including collection optics and spectrometer 512b and a light source 512a, e.g., a xenon, mercury, or halide high energy light source. For example, a Xe lamp with a power output of 300-500 W or higher can be used. In some implementations, one or more fiber optics can be utilized in combination with vacuum feedthroughs to transmit light collected by collection optics located in-vacuum to the out-of-vacuum metrology components 510a, 510b.

The light source 512a provides a light beam 508 with which to probe the surface 503 of the workpiece 502, and the spectrometer 512b is configured to collect and process the reflected light signal 514 from workpiece 502.

Out-of-vacuum metrology component 510b includes multiple metrology components 516 for performing photoluminescence (PL) measurements on the workpiece 502 in the transfer chamber 500, including a light source 516a, power meter 516b, and beam-splitter 518. Light source 516a can be, for example, an ultraviolet (UV) laser, lamp, or LED. For example, a 405 nm UV laser with an average power output of a few μW to a few mW can be used. Power output of the light source 516a can be selected to be lower than photo-bleaching effect regimes, e.g., where photoluminescence intensity output will be time-dependent on exposure to the light source 516a. Power meter 516b can be utilized to sample the beam energy and can include, for example, a photodiode sensor. Beam-splitter 518 can be utilized to divide the beam of the light source 516a in order to sample a reference beam.

Whereas the light beam 508a from the light source 512a can be directed onto the workpiece 502 along an axis normal to the surface of the workpiece 502, the light beam 508b from the light source 516a can be directed onto the workpiece 502 along an axis at an oblique angle relative to the surface of the workpiece 502.

In some implementations, an out-of-vacuum metrology component 510 can include a light modulation unit configured to provide two different light sources 508 to the in-vacuum metrology head 504, e.g., having different amplitudes, phase, polarization, or the like.

In some implementations, a thickness of the deposited layer on the workpiece 502 is measured using the in-vacuum metrology head 504 and out-of-vacuum metrology component 510a by collecting a modulated source signal 508 and the reflected signal 514 by the spectrometer 512a. The collected data can be analyzed to determine a thickness of the deposited layer. For example, a controller can store a library of reference spectra, each reference spectrum having an associated thickness value. A measured spectrum can be compared to the library of reference spectra, and the reference spectrum that is the best fit to the measured spectrum, e.g., using a sum of squared differences metric, can be selected as a matching reference spectrum. The thickness value that is associated with the matching best-fitting reference spectrum can then be used as the measured thickness value.

In some implementations, a photoluminescence (PL) measurement is performed using the in-vacuum metrology head 504 and out-of-vacuum metrology component 510b. The PL measurement can be utilized, in combination with the reflectometry measurement described above, to calculate a dopant level in a particular deposited layer. Calculating dopant levels, which are an extrinsic factor, includes determining a normalization factor to convert the data to an intrinsic, materials property factor. The extrinsic factors to consider include: (1) thickness for total materials in the analysis volume, e.g., the deposited layer(s) of interest on the workpiece, (2) laser intensity of light source 516a, and (3) working distance change and tilt angle which affects the analysis volume. As such, ideal analysis system will measure the thickness, which is done by the reflectometry apparatus using out-of-vacuum metrology head 510a and in-vacuum metrology head 504. Laser intensity (excitation source for PL) can be determined by (1) use of a power meter 516b and (2) beam splitter 518 to portion going to the workpiece 502 and the power meter 516b, and (3) calibration factor between the reading on power meter and workpiece. Working distance change and tilt angle can be corrected by measurement sensors 506 and a position of the in-vacuum metrology head 504 with respect to a surface 503 of the workpiece 502.

In some implementations, beam-splitter 518 is utilized to split a portion of the light beam 508b from light source 516a and direct it towards the power meter 516b to be measured. A photoluminescence signal 509 from the deposited layer on the workpiece 502 is collected at the spectrometer, e.g., spectrometer 512a or another spectrometer located in out-of-vacuum metrology component 510b (not pictured). The measured PL data is analyzed, e.g., by plotting the signal intensity versus wavelength and a Gaussian curve is fit to the plot. The maximum wavelength, maximum intensity and full-width at half-maximum (FWHM) are found and normalized to the intensity of the light beam 508b from light source 516a and the thickness of the deposited layer as determined using the reflectometry measurements. The normalized plot is compared to one or more calibration plots or "golden samples" (as described in further detail with reference to FIG. 7 below), and a dopant level in the deposited layer is determined.

In some implementations, the thickness and dopant level data extracted using the PL and reflectometry measurements are sent to the MES 220 for determining process factor adjustments and providing the adjusted process factor(s) to one or more deposition chambers 108. Further details are described with reference to FIG. 7 below.

In some implementations, a process factor adjustment for adjusting a thickness of the deposited layer includes modulating the static deposition rate, e.g., an evaporation temperature, a scanning rate, e.g., a dynamic deposition rate, or both to achieve the desired thickness. A process factor adjustment to achieve a desired dopant level can include adjusting relative deposition rates, e.g., evaporation temperatures and scanning rate. Such a shift deposition rates has impact on total thickness. As such, the two adjustments would need to be correlated to ensure both the thickness and dopant level specifications are met.

Figure 6:
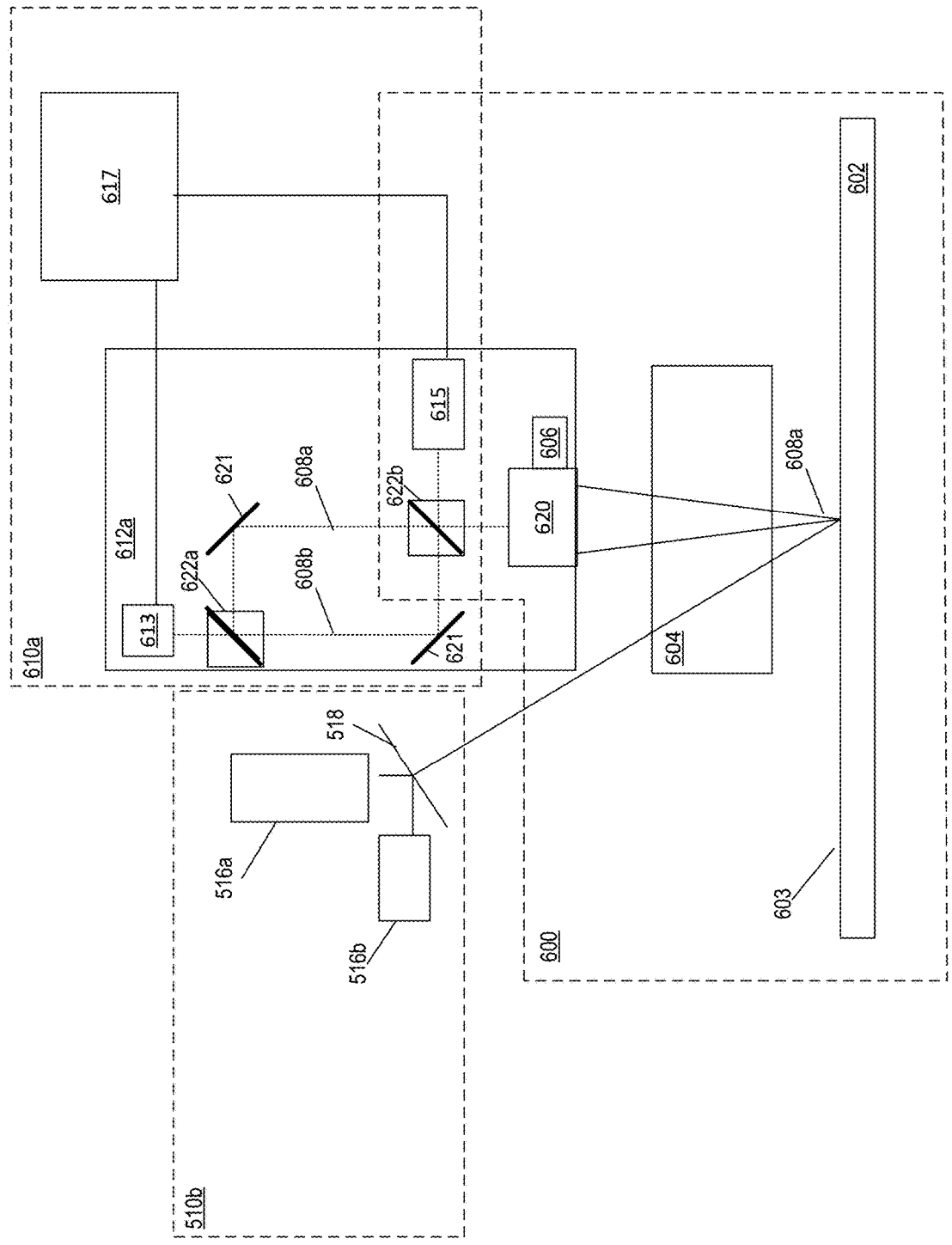
FIG. 6 illustrates a schematic of an example digital holographic microscopy device and photoluminescence apparatus for an in-line process monitoring and control system.

FIG. 6 illustrates a schematic of an example digital holographic microscopy (DHM) device and photoluminescence (PL) apparatus for an in-line process monitoring and control system. As depicted in FIG. 6, a workpiece 602, e.g., workpiece 106, is located within the transfer chamber 600, e.g., on a mount 204. An in-vacuum metrology head 604, e.g., in-vacuum metrology head 202, including or more in-vacuum components, can be located within the transfer chamber 600 and is configured to be positionable with respect to the workpiece 602, similarly as described with reference to in-vacuum metrology head 504 with reference to FIG. 5.

Additionally, some or all of the components of a DHM device 612a can be located inside the transfer chamber 600, where a reference beam and a sample beam from light source 613 can be provided into the transfer chamber 600 via fiber optics. The DHM device 612a includes the necessary components required to perform interferometric measurements according to known standard. Components of the DHM device 612a include a light source 613, optics forming a Michelson interferometer, e.g., dichroic mirrors 622 and mirrors 621, and a detector 615, e.g., a CCD camera.

Briefly, the interferometric measurement can be performed by splitting a beam from light source 613 using a beam splitter 622a into a reference light beam 608b as a reference wave front and an object light beam 608a. The object light beam 608a is provided to the workpiece 602 to illuminate a test region of the workpiece 602, e.g. test region 402, creating an object wave front.

The reflected object wave front is collected by a microscope objective 620 and the object and reference wave fronts are joined together by a second beam splitter 622b to interfere and create a holographic image which is recorded by a CCD camera 615. Other possible configurations are possible with the end goal to produce an interferometric interference pattern at the CCD 615 and generate a digitally constructed image.

The height/tilt sensor 606 located on the in-vacuum metrology head 604 can collect depth-of-focus information, tilt information, spatial depth information and can determine a position and/or tilt of the workpiece 602 with respect to the microscope objective 620 and/or head 604, where the microscope objective 620 and/or head 604 can be positioned to maintain a constant height and tilt with respect to a surface 603 of the workpiece 602. The DHM device 612a and/or head 604 can be coupled to one or more actuators that provide relative motion so as to achieve the desired relative height and tilt.

The in-vacuum metrology head 604 can further be configured to direct, e.g., via a set of optical components, one or more light beams, e.g., from out-of-vacuum metrology head 510b to a surface 603 of the workpiece 602. In some implementations, the one or more light beams can be directed to the surface 603 of the workpiece using one or more of free space optics and/or fiber optics. The multiple light beams can each have respective different values for one or more optical characteristics including, for example, wavelength ranges, light intensities, pulse shape, and the like.

As depicted in FIG. 6, one or more out-of-vacuum metrology components 610a, e.g., DHM control unit 617, can be in data communication with the one or more in-vacuum components, e.g., CCD 615.

A DHM control unit 617 can analyze the hologram data captured by the CCD 615 and convert it to the 3D topography image. The DHM control unit 617 can correct for the focus offset and tilt captured by the height/tilt sensor 606, and then find the centers of gravity of the desired features. By correcting for the depth of focus and tilt, the DHM control unit 617 can extract a thickness of the deposited layer on the workpiece 602.

In some implementations, one or more fiber optics can be utilized in combination with vacuum feedthroughs to transmit light collected by collection optics location in-vacuum to the out-of-vacuum metrology components 610a, 510b.

Similar to the depiction with reference to FIG. 5, out-of-vacuum metrology head 510b includes multiple metrology components 516 for performing photoluminescence (PL) measurements on the workpiece 602 in the transfer chamber 600. Additionally, as described above with reference to FIG. 5, the thickness and dopant level data extracted using the PL and interferometric measurements are sent to the MES 220 for determining process factor adjustments and providing the adjusted process factor(s) to one or more deposition chambers 108. Further details are described with reference to FIG. 7 below.

Example Process of the In-Line Process Monitoring and Control System

Returning to FIG. 1, in at least some of the transfer chambers, e.g., in each transfer chamber, the workpiece is measured. In some implementations, the workpiece passes through each chamber 108 in the line, e.g., through chamber 108a, chamber 108b, chamber 108c, etc. In this case, at least for the configuration shown in FIG. 1, the workpiece would enter a transfer chamber 110 and be measured after having multiple organic layers deposited—either since the start of the line or since the prior measurement. However, this is not necessary. For example, the workpiece could pass through only one deposition chamber of each pair that are accessible from an access chamber 118, e.g., through chamber 108b, chamber 108d, chamber 108f, etc. As another example, an access chamber could have only one deposition chamber. As another example, the access chamber could be removed entirely and the deposition chambers could have direct access to one or more transfer chambers. For example, the workpiece could be moved from a transfer chamber into a deposition chamber through one side of the chamber, and then removed through another side of the deposition chamber into another transfer chamber. In any of these configurations, it is possible for the workpiece to enter a transfer chamber 110 and be measured after having a single organic layers deposited—either since the start of the line or since the prior measurement.

In general, the measurements are used to as feedback to control the processing parameters of the deposition chamber (s) that deposited the layer(s) being measured. For example, if a first layer is deposited in chamber 108a, and the workpiece is then transported to transfer chamber 110, the measurements can be used to adjust the processing parameters of chamber 108a, e.g., to achieve a target thickness or to improve thickness uniformity. As another example, if a first layer is deposited in chamber 108a and a second layer is deposited in chamber 108b, and the workpiece is then transported to transfer chamber 110, the measurements can be used to adjust the processing parameters of chambers 108a and 108b.

Figure 7:
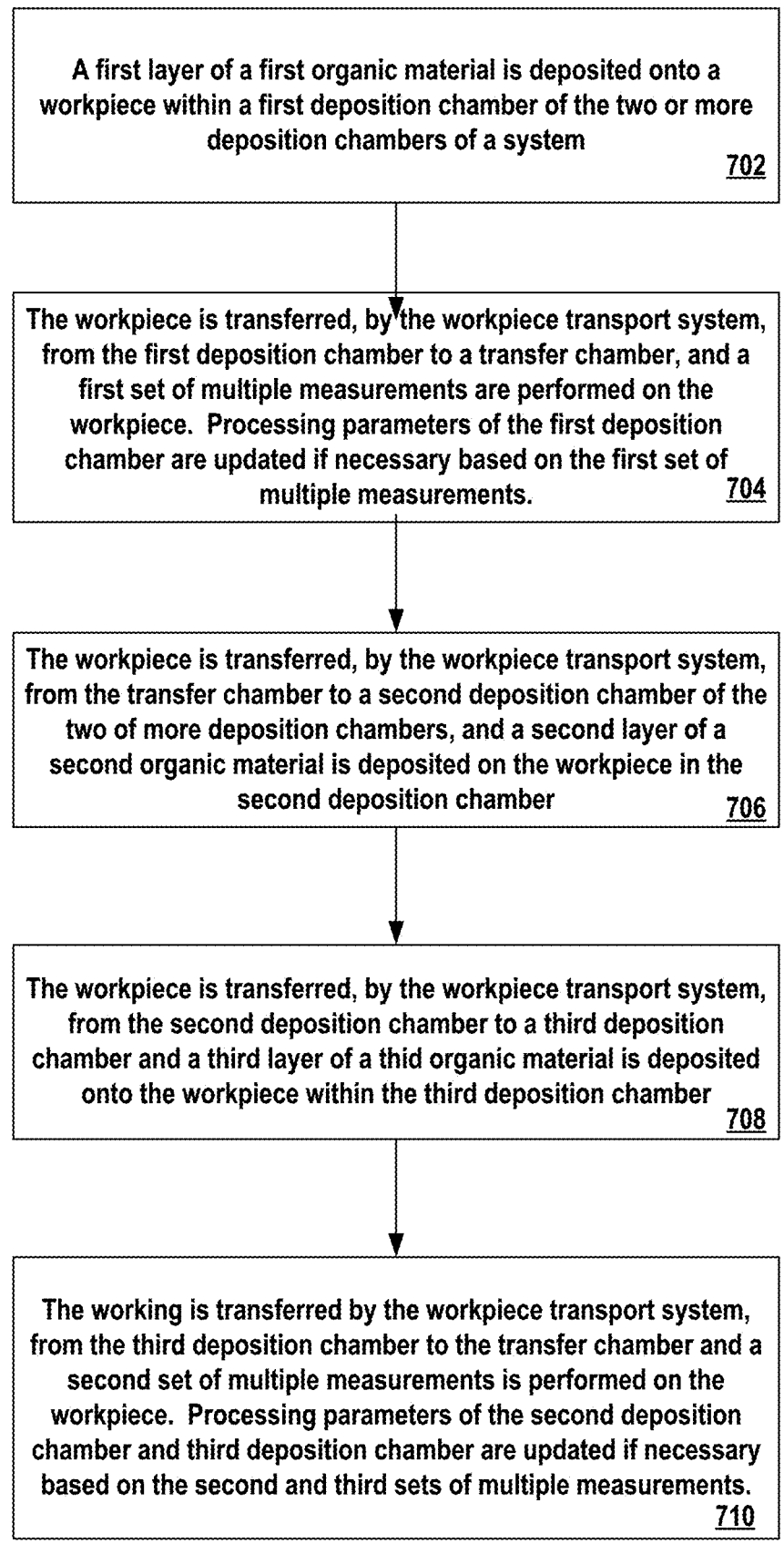
FIG. 7 is a flow diagram of an example process of the in-line process monitoring and control system.

FIG. 7 is a flow diagram of an example process of the in-line process monitoring and control system for the sequential deposition of respective layers on a workpiece. In a first step, a first layer of a first organic material is deposited onto the workpiece within a first deposition chamber of the two or more deposition chambers of a system (702). A layer can be deposited by a deposition chamber, e.g., deposition chamber 108c, of the multiple deposition chamber 108 of system 100.

The workpiece is transferred, by the workpiece transport system, from the first deposition chamber to a transfer chamber, and a first set of multiple measurements are performed on the workpiece by the metrology head and a data processing apparatus in data communication with the metrology head (704). A workpiece transport system, e.g., workpiece transport system 104, can transfer the workpiece 106 from the deposition chamber 108c to a transfer chamber 110a, where a first set of measurements can be performed on the workpiece 106 by the in-line processing and control system 102, including an in-vacuum metrology head 112.

In some implementations, the first set of multiple measurements are provided to the MCU 212, the output of which is provided to the MES 220, as described in further detail above with reference to FIG. 2A. The MES 220 may then in turn determine adjusted process parameters 222 to provide to the controller 116 of the particular deposition chamber(s) 108, e.g., the deposition chamber 108c, such that a next deposition on a workpiece 106 by the deposition chamber(s) 108 utilizing the adjusted process parameters 222.

The workpiece is transferred, by the workpiece transport system, to a second deposition chamber of the two or more deposition chambers and a second layer of a second organic material is deposited onto the workpiece in the second deposition chamber (706). The workpiece 106 can then be transferred, by the workpiece transport system 104, to a second deposition chamber, e.g., deposition chamber 108e, where a second layer is deposited on the workpiece 106.

In some implementations, the process further includes transferring, by the workpiece transport system, the workpiece from the second deposition chamber to a third deposition chamber of the two or more deposition chambers and depositing a third layer of a third organic material onto the workpiece within the third deposition chamber (708). The workpiece 106 can be transferred again, by the workpiece transport system 104, to a third chamber, e.g., chamber 108f via an access chamber 118b, to deposit a third layer onto the workpiece 106 within the third deposition chamber 108f.

In some implementations, the process further includes transferring, by the workpiece transport system, the workpiece from the third deposition chamber to the transfer chamber and performing a second set of multiple measurements on the workpiece by the metrology head and the data processing apparatus in data communication with the metrology head (710). The second set of multiple measurements can include information about the second deposited layer and third deposited layer that were deposited on the workpiece. The workpiece 106 can be transferred by the workpiece transport system 104 from the third chamber 108f into a transfer chamber 110b, where a second set of measurements can be measured by the in-line processing and control system 102 while the workpiece 106 is located within transfer chamber 110b.

In some implementations, the second set of multiple measurements are provided to the MCU 212, the output of which is provided to the MES 220, as described in further detail above with reference to FIG. 2A. The MES 220 may then in turn determine adjusted process parameters 222 to provide to the controller 116 of the particular deposition chamber(s) 108, e.g., the second deposition chamber 108e and the third deposition chamber 108f, such that a next deposition on a workpiece 106 by the deposition chamber(s) 108 utilizing the adjusted process parameters 222.

In some implementations, vibration, e.g., from the moving parts of the system 100, is accounted for by averaging the multiple measurements collected or by otherwise normalizing the collected data.

In some implementations, deposition characteristics include an intrinsic doping level of a deposited layer. Extracting the intrinsic doping level of a deposited layer can require information about a deposited layer thickness, e.g., perpendicular to surface 107 of the workpiece, in order to normalize the intrinsic doping level information. The deposited layer thickness information may be extracted, for example, using reflectometry measurements performed on a test region of the particular deposited layer. In another example, the deposited layer thickness information may be extracted using interferometric measurements, e.g., using the DHM measurement system, performed on the test region of the particular deposited layer. In yet another example, the deposited layer thickness information may be extracted using transmission measurements performed on the test region of the particular deposited layer.

In some implementations, as depicted in FIGS. 5 and 6, photoluminescence measurements can be utilized to extract intrinsic doping of a deposited layer when normalized to various factors including beam intensity, e.g., of the laser light source, thickness of the deposited layer, where the thickness is measured using one of the techniques listed above, e.g., reflectometry, transmission, interferometry, etc., and the tilt and depth of focus of the in-vacuum metrology head with respect to the surface of the workpiece, e.g., using tilt/height information from the in-vacuum metrology head.

PL measurements can be calibrated to a set of known intrinsic doping levels for various organic materials. In one example, a golden sample comparison having known thicknesses and dopant levels can be utilized as a calibration sample, e.g., where an absolute intensity of the PL measurement of the golden sample is compared to a PL measurement of a test sample. In another example, a calibration chart can be generated using a set of samples with known dopant levels for a particular organic material. The calibration chart can include a plot of doping level versus PL measurement intensity for a particular known thickness of the test layer, where additional points can be extrapolated along the plot.

In some implementations, a transfer chamber includes a temperature control and measurement apparatus configured to regulate a temperature of the workpiece in the transfer chamber in order to perform characterization measurements of the workpiece at a particular temperature. Temperature control and measurement apparatus can include a temperature gauge to measure a temperature of the workpiece, e.g., a pyrometer, thermocouple contacting a surface of the workpiece, or the like. Temperature control can be, for example, a cold finger, a Peltier cooler, or the like, to regulate a temperature of the workpiece to a particular temperature range during a PL measurement of the workpiece. In another example, temperature-dependent characterization measurements, e.g., temperature-dependent PL measurements, can be performed on the workpiece within the transfer chamber using a temperature control and measurement apparatus.

In some implementations, characterization measurements can be performed on two or more deposited layers, where the results of the characterization measurements may be de-convoluted from the measurement data, e.g., transmission data collected through the two or more deposited layers.

Pixel Placement Accuracy and Shadowing

At least some existing techniques for pixel placement accuracy (PPA) have a limited focal depth range, and thus may not be suitable for in-line applications, as the time required for precise vertical placement may result in unsatisfactory throughput. In addition, at least some PPA measurement technology requires a lengthy exposure time to perform a measurement.

Again, such technology may not be suitable for in in-line applications because moving parts within the multiple deposition chambers can lead to vibration, which can potentially cause inaccuracies and smearing of the data. Moreover, with both white light and UV sources and auto focus system, current PPA measurement systems require moving parts which can potentially generate particles that can lead to contamination and reduced yield and performance issues.

Digital holographic microscopy (DHM) can be used in an in-line system described above, e.g., the system 2A or 2B using the DHM system of FIG. 6, to measure pixel placement accuracy, lithography overlay, 4D metrology (time resolved 3D metrology—for example photoresist thickness versus spin time), and defects. Such in-line monitoring and control can enable better manufacturing yield and device performance of the end products as well as reduce the impact from excursions.

Digital holographic microscopy can be used to determine the offset between the mask used to deposit a layer, e.g., the OLED layer, and the substrate. Referring to FIG. 8B, the workpiece 900 can include a substrate 905 on which a fiducial feature 910 is formed. The fiducial feature 910 can be a projection up from the surface of the substrate 905 or a recess in the surface of the substrate 905. The projection can be formed of a metal, dielectric, semiconductor, etc., or combination thereof, as would occur in standard processing steps along backplane (TFT panel) fabrication. Local fiducial alignment will be parallel to the global alignment between TFT backplane and OLED subpixel creation.

Figure 8A:
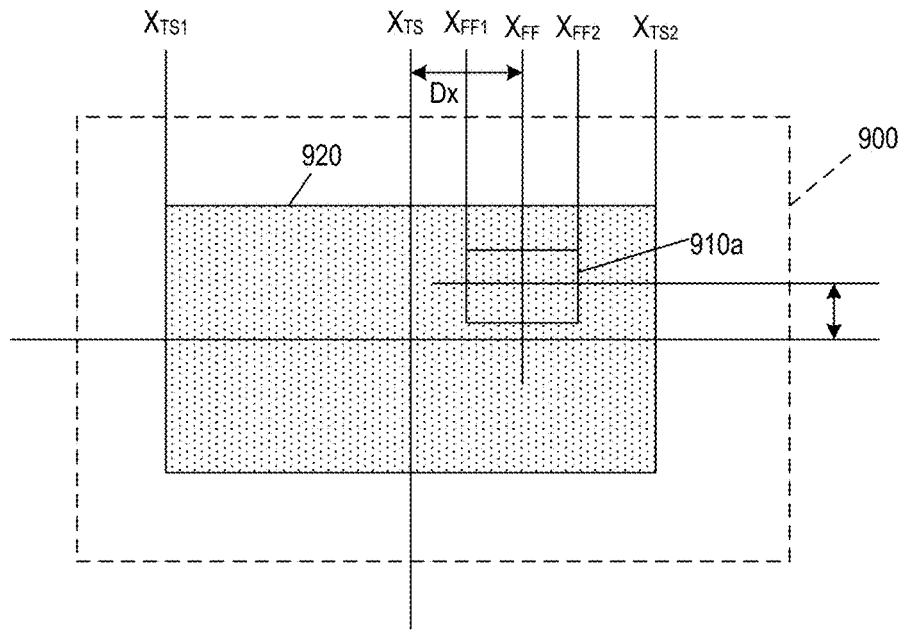
FIGS. 8A and 8B illustrate top and side views, respectively, of a test structure on a substrate for determining alignment of a deposited layer to a fiducial.
Figure 8B:
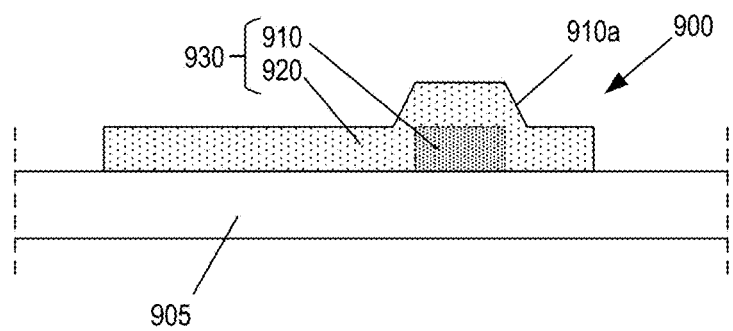

As shown in FIGS. 8A and 8B, during deposition of a layer of the OLED, a portion of the layer can form a test structure 920. The layer can be an organic layer, e.g., an electron injection layer (EIL), an electron transport layer (ETL), a hole blocking layer (HBL), the light emissive layer (EML), an electron blocking layer (EBL), a hole transport layer (HTL), or a hole injection layer (HIL), deposited onto the workpiece 900 as part of formation of the OLED device. In particular, material of the layer can be deposited through a shadow mask during the deposition step, with some apertures in the mask corresponding to the OLED devices being constructed, and at least one aperture corresponding to the test structure 920.

The test structure 920 can overlay, e.g., completely overlay and cover, the fiducial feature 910 as shown in FIGS. 8A and 8B. A distance of the center of mass of the test structure from the fiducial feature 910 can be given by Dx along the x-axis and Dy along the y-axis. The desired values for Dx and Dy can be zero, or some other preset amount.

Figure 9:
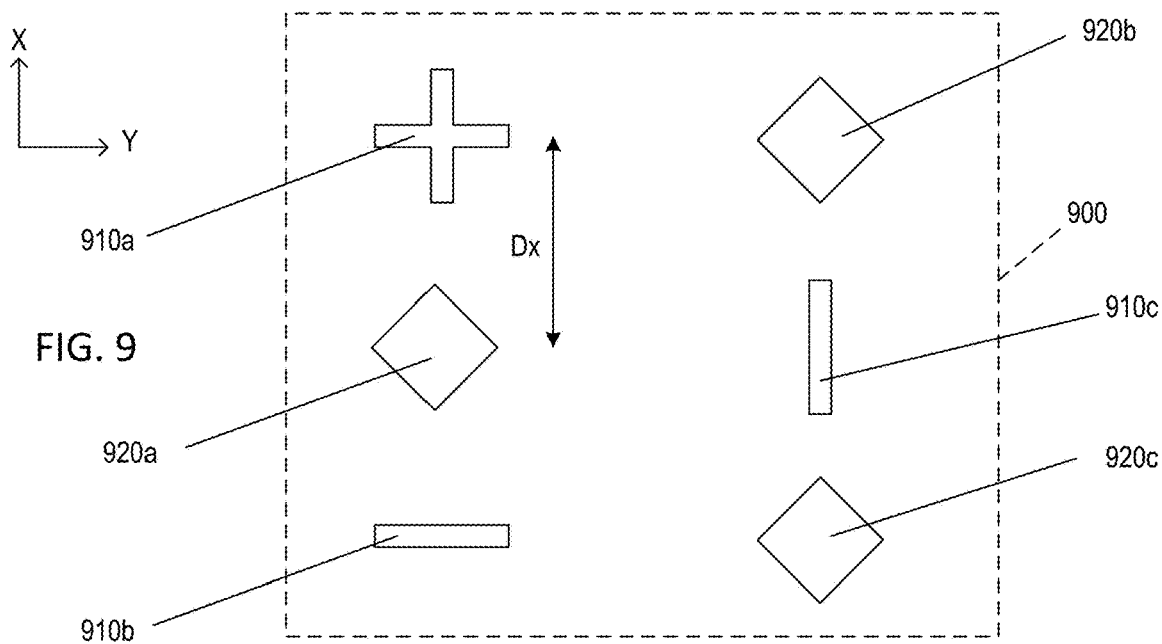
FIG. 9 illustrates a top view of multiple fiducial features and test structures on a substrate for determining alignment.

Alternatively, the test structures 920 and fiducial features 910 can be non-overlapping but sufficiently close that both will be within the field of view of the digital holographic microscope. For example, as shown in FIG. 9, fiducial features 910a-910c can be formed on the workpiece 900. The test structures 920a-920c can be layers from different sub-pixels, e.g., green, red and blue light emissive layers, respectively, or layers from the same sub-pixel, e.g., the hole blocking layer (HBL), light emissive layer (EML), and electron blocking layer (EBL) for the same color.

The test structures can be re deposited to be a desired distance from a proximal fiducial along one axis, e.g., the x-axis, and have no offset from the proximal fiducial along another axis, e.g., the y-axis. For example, test structure 920a can have a desired distance Dx from the fiducial feature 910a along the x-axis and have a desired distance Dy=0 from the fiducial feature 910a along the y-axis.

Together, the fiducial feature 910 and the test structure 920 can provide alignment features 930. The fiducial features 910 can be formed on the substrate as part of the process of depositing the initial metal layer (typically designated as M1 or metal 1) on the workpiece. This initial metal layer can be the first metal layer deposited above the poly gate layer.

After deposition of the layer and test structure 920, the workpiece is removed from the deposition chamber and measured using the in-line metrology head, and in particular the digital holographic microscope. A DHM control unit can analyze the data captured by the metrology head and convert it to a 3D topography image. The DHM control unit and/or a separate computer, can correct for focus offset and tilt captured by the height/tilt sensor 606.

In addition, control system, e.g., the DHM control unit and/or a separate computer, can be programmed to identify the edges of the fiducial feature and the test structure from the topographic image using edge-finding techniques, e.g., by detection of regions exceeding a certain slope. Based on the locations of the edges, the control system can determine X and Y coordinates for the fiducial feature and the test structure. As an example, assuming the test structure 920 is rectangular, an X coordinate XTS can be determined by averaging x-coordinates XTS1 and XTS2 of two opposite edges of the test structure 920. Similarly, assuming the fiducial feature 910 is rectangular, an X coordinate XFF can be determined by averaging x-coordinates XFF and XFF of two opposite edges of a raised region 910a within the test structure. The difference between the x-coordinate XTS for the test structure 920 and the x-coordinate XFF for the fiducial feature 910 provides an x-offset ΔX for the particular layer. A similar approach can be used to provide a y-offset ΔY. With shadowing, the "edge" can be considered as the 95% thickness boarder line vs. the average thickness at the center of either features.

Although the above discussion assumes rectangular features, more generally the control system can be programmed to determine the centers of gravity of the fiducial feature and the test structure, and determine the difference between the centers of gravity.

The offsets ΔX and ΔY can be compared to expected values to detect anomalous alignment overlay phenomena. Differences between the offsets and the expected values can be logged, and analyzed to identify possible root causes such as poor alignment or poor contact of the shadow mask to the substrate. Poor contact can be result of a defect on substrate that prevents good contact with the fine metal mask, or warping of the fine metal mask. If the difference between an offsets and an expected value exceeds a threshold, then the control system can generate an alert to an operator of the manufacturing system.

Figure 10:
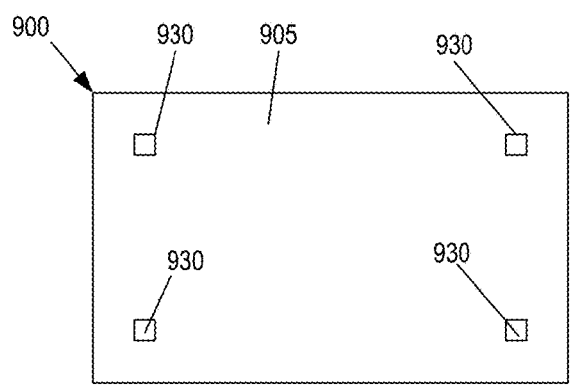
FIG. 10 illustrates a top view of a substrate with multiple test structures on a substrate.

Referring to FIG. 10, in some implementations multiple alignment features 930 are formed on the workpiece 900. Each alignment feature provides a pair of offsets ΔXi and ΔYi. Each ΔXi and ΔYi can be calculated as the difference between the measured position of the alignment feature and the desired or intended position of the alignment feature, e.g., $$\Delta X_i = XM_i - XD_i \text{ and } \Delta Y_i = YM_i - YD_i$$

where $(XM_i, YM_i)$ is the measured coordinates of the alignment feature and $(XD_i, YD_i)$ are the desired coordinates of the alignment feature. All of the coordinates can be with respect to a global fiducial as an origin, or each pair of coordinates $(XM_i, YM_i)$, $(XD_i, YD_i)$ can be relative to a local fiducial.

The desired angular relationship can be expressed as $$\theta D_{ij} = \tan^{-1}\left(\frac{YD_i - YD_j}{XD_i - XD_j}\right)$$

where $(XD_i, YD_i)$ and $(XD_j, YD_j)$ are coordinates with respect to a global fiducial as the origin.

Similarly, the measured angular relationship can be expressed as $$\theta M_{ij} = \tan^{-1}\left(\frac{YM_i - YM_j}{XM_i - XM_j}\right)$$

again where $(XM_i, YM_i)$ and $(XM_j, YM_j)$ are coordinates with respect to the global fiducial as the origin.

An angular offset $\delta\Theta_{ij}$ can be defined as $\Theta M_{ij} - \Theta D_{ij}$.

Optimization of alignment of a workpiece to the shadow mask can be performed by simultaneous minimization of the factors ΔXi and ΔYi and $\delta\Theta_{ij}$ either interactively or iteratively. For example, minimization can be performed on a cost function T such as $$T(\Delta X, \Delta Y, \delta\theta) = \sum_{i=1, i!=j}^{N} \sum_{j=1}^{N} \sqrt{\Delta X_{i,j}^2 + \Delta Y_{i,j}^2} + \delta\theta_{i,j}$$

In some implementations, different weighting factors can be assigned to the different terms, e.g., the cost function can be expressed as $$T(\Delta X, \Delta Y, \delta\theta) = \sum_{i=1, i!=j}^{N} \sum_{j=1}^{N} P * \sqrt{\Delta X_{i,j}^2 + \Delta Y_{i,j}^2} + R * \delta\theta_{i,j}$$

where P and R are weights, e.g., percentage weights, for the position offset and rotation offset, respectively. The controller can be configured to accept user input to set different weighting factors for P and R.

Measuring the relationship with respect to the global fiducials, which are tied to the overlap with backplane (TFT driving circuit) locations, allows a desired overlap for all layers to align properly to the backplane for proper device function. Alternatively, instead of measuring the difference in position between a global fiducial feature and a test structure 920, the DHM system can be used to measure a difference in position between a first test structure deposited for a first layer using a first shadow mask in a first deposition chamber, and a second test structure deposited for a second layer using a second mask in a second deposition chamber. This provides a layer-to-layer comparison in positions of the shadow masks used for the respective layers. The difference can provide an error signal to adjust the position relative to a subsequent workpiece for the first shadow mask in the first deposition system or the second shadow in the second deposition chamber. However, by measuring alignment of a first test structure versus a global fiducial permits subsequent test structures to align properly to the backplane.

Alternatively or in addition, the offsets ΔX and ΔY, or the difference between the offsets and target offsets, can be used as an error signal. The error signal can be used, for example, as feedback to adjust the mask position in the deposition chamber for the layer that provided the test structure 920 so as to improve accuracy of alignment of the mask in processing of a subsequent workpiece, or as feedforward to adjust a position of a mask during deposition of a subsequent layer on the workpiece 900 in a subsequent deposition chamber so that the pattern of the subsequently deposited layer more accurately aligns with the pattern of the already deposited layer.

Figure 11:
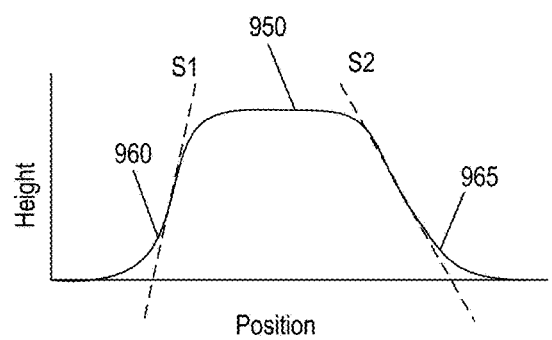
FIG. 11 is a schematic illustration of a profile scan generated from topology from a DHM system.

When depositions are performed through a physical mask, e.g., the fine metal mask, the edges of the opening can create a "shadowing" effect in which the thickness decreases gradually to zero toward the edge of the opening. FIG. 11 is a schematic illustration of a profile scan generated from topology from a DHM system from a test structure subject to the shadow effect. The graph 950 shows the height of the test structure as a function of lateral position across the test structure, and includes sloped regions 960, 965.

The slope or profile of the edges of the test structure can be calculated from the topology information. For example, a line having a slope S1 can be fit to a sloped portion of a first edge of the test structure, and a line having a slope S2 can be fit to the sloped portion along an opposite second edge of the test structure.

The slopes S1, S2 can be compared to expected values to detect anomalous phenomena. For example, if either slope S1, S2 varies by more than a threshold from a target value, then the control system can log an anomaly. Alternatively or in addition, the slopes S1, S2 can be compared to each other to detect anomalous phenomena. For example, if the slopes S1, S2 differ by more than a threshold amount, then the control system can log an anomaly. In some implementations, where the control system logs an anomaly, the control system then generates an alert to an operator of the manufacturing system. The slopes can be analyzed to identify possible root causes such as poor alignment of the shadow mask to the substrate, a defect on substrate that prevents good contact with the fine metal mask, or warping of the fine metal mask.

An advantage of the DHM technique is that it permits both PPA and shadow characterization to be determined simultaneously, thus providing improved throughput.

Conclusion

The controller and other computing device parts of systems described herein can be implemented in digital electronic circuitry, or in computer software, firmware, or hardware to carry out the various operations discussed. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. A number of implementations have been described. Nevertheless, it will be understood that various modifications may be made.

What is claimed is:

1. An organic light-emitting diode (OLED) deposition system comprising:
    a workpiece transport system configured to position a workpiece within the OLED deposition system under vacuum conditions;
    a deposition chamber configured to deposit a first layer of organic material onto the workpiece;
    a metrology system having one or more sensors configured to measure the workpiece after deposition in the deposition chamber, the metrology system including a digital holographic microscope positioned to receive light from the workpiece and generate a thickness profile measurement of the first layer of organic material on the workpiece; and
    a control system to control a deposition of the first layer of organic material onto the workpiece, the control system configured to
    cause the deposition chamber to deposit the first layer of organic material onto the workpiece,
    cause the workpiece transport system to transfer the workpiece from the deposition chamber to a position at which the one or more sensors measure of the workpiece,
    receive the thickness profile measurement from the metrology system,
    adjust processing of a subsequent workpiece at the deposition chamber or adjust processing of the workpiece at a subsequent deposition chamber based on the thickness profile, and
    determine a position of a first test structure relative to a fiducial feature on the workpiece or a second test structure formed from a second layer based on the thickness profile, including
    detect first edges of the first test structure based on the thickness profile and to detect second edges of the fiducial feature or second test structure based on the thickness profile, and
    determine the position of the first test structure relative to the fiducial feature or the second test structure based on the edges.

2. The system of claim 1, wherein the deposition chamber is a first deposition chamber and the system comprises a second deposition chamber, and a transfer chamber between the first deposition chamber and the second deposition chamber, and the one or more sensors are positioned to measure the workpiece in the transfer chamber.

3. The system of claim 1, wherein the control system is configured to adjust processing of a subsequent workpiece at the deposition chamber.

4. The system of claim 1, wherein the deposition chamber comprises a shadow mask, and the control system is configured to cause an actuator to adjust a relative position between the subsequent workpiece and the shadow masked based on the thickness profile.

5. The system of claim 2, wherein the control system is configured to adjust processing of the workpiece at the second deposition chamber.

6. The system of claim 2, wherein the second deposition chamber comprises a shadow mask, and the control system is configured to cause an actuator to adjust a relative position between the workpiece and the shadow mask based on the thickness profile.

7. The system of claim 1, wherein the control system is configured to determine a first position of the first test structure from the first edges and to determine a second position of the fiducial feature or the second test structure, and to calculate a relative position based on the first position and the second position.

8. The system of a claim 7, wherein the control system is configured to calculate the first position as a center of mass of the first test structure.

9. The system of claim 7, wherein the control system is configured to determine a position of a first edge of the first test structure and determine a position of an opposite second edge of the first test structure based on the thickness profile, and to calculate the first position from the positions of the first and second edges.

10. The system of claim 9, wherein the control system is configured to determine a position of a third edge of the fiducial feature or the second test structure and determine a position of an opposite fourth edge of the fiducial feature or the second test structure, and to calculate the second position from the positions of the third and fourth edges.

11. The system of claim 1, wherein the control system is configured to determine the difference in position between the first test structure and the fiducial feature.

12. The system of claim 1, wherein the control system is configured to determine the difference in position between the first test structure and the second test structure.

13. An organic light-emitting diode (OLED) deposition system comprising:
a workpiece transport system configured to position a workpiece within the OLED deposition system under vacuum conditions;
a deposition chamber configured to deposit a first layer of organic material onto the workpiece;
a metrology system having one or more sensors configured to measure the workpiece after deposition in the deposition chamber, the metrology system including a digital holographic microscope positioned to receive light from the workpiece and generate a thickness profile measurement of the first layer of organic material on the workpiece; and
a control system to control a deposition of the first layer of organic material onto the workpiece, the control system configured to
cause the deposition chamber to deposit the first layer of organic material onto the workpiece,
cause the workpiece transport system to transfer the workpiece from the deposition chamber to a position at which the one or more sensors measure of the workpiece,
receive the thickness profile measurement from the metrology system,
adjust processing of a subsequent workpiece at the deposition chamber or adjust processing of the workpiece at a subsequent deposition chamber based on the thickness profile,
determine a position of a first test structure relative to a fiducial feature on the workpiece or a second test structure formed from a second layer based on the thickness profile,
and
determine a first slope at a first edge of the first or second test structure.

14. The system of claim 13, wherein the control system is configured to compare the first slope to a target slope.

15. The system of claim 13, wherein the control system is configured to determine a second slope at a second edge of the test structure relative and to compare the first slope to the second slope.

16. A computer program product comprising a non-transitory computer readable medium comprising instructions to cause one or more data processing apparatuses to:
cause a deposition chamber to deposit a layer of an organic material onto a workpiece in a device region and a first test region separate from the device region;
cause a workpiece transport system to transfer the workpiece from the deposition chamber to measurement position for a metrology system;
receive from a digital holographic microscope of the metrology system a thickness profile measurement of the layer on the workpiece;
adjust processing of a subsequent workpiece at the deposition chamber or adjust processing of the workpiece at a subsequent deposition chamber based on the thickness profile;
determine a position of a first test structure relative to a fiducial feature on the workpiece or a second test structure formed from a second layer based on the thickness profile;
detect first edges of the first test structure based on the thickness profile and to detect second edges of the fiducial feature or second test structure based on the thickness profile; and
determine the position of the first test structure relative to the fiducial feature or the second test structure based on the edges.

17. The computer program product of claim 16, comprising instructions to adjust processing parameters for the workpiece at a subsequent deposition chamber.

18. The computer program product of claim 16, comprising instructions to adjust processing parameters for a subsequent workpiece at the deposition chamber.

* * * * *